(12) United States Patent
Thomas et al.

(10) Patent No.: US 7,768,821 B2
(45) Date of Patent: Aug. 3, 2010

(54) NON-VOLATILE SRAM MEMORY CELL EQUIPPED WITH MOBILE GATE TRANSISTORS AND PIEZOELECTRIC OPERATION

(75) Inventors: Olivier Thomas, Revel (FR); Michael Collonge, Romans (FR); Maud Vinet, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 204 days.

(21) Appl. No.: 12/169,264

(22) Filed: Jul. 8, 2008

(65) Prior Publication Data
US 2009/0016095 A1 Jan. 15, 2009

(30) Foreign Application Priority Data
Jul. 9, 2007 (FR) ................... 07 56348

(51) Int. Cl.
G11C 11/00 (2006.01)
G11C 11/34 (2006.01)
(52) U.S. Cl. .................. 365/157; 365/154; 365/185.26; 257/414; 257/415; 257/416; 257/417; 257/418; 257/419; 257/420
(58) Field of Classification Search ........................ None
See application file for complete search history.

(56) References Cited
U.S. PATENT DOCUMENTS
4,435,786 A   3/1984   Tickle
5,757,696 A   5/1998   Matsuo et al.
7,427,797 B2  9/2008   Ohguro et al.
2003/0042528 A1  3/2003  Forbes
2006/0284239 A1  12/2006  Park
2007/0211519 A1  9/2007   Thomas et al.
2008/0055976 A1*  3/2008   Aritome ................ 365/185.01
2009/0040808 A1  2/2009   Krieger FOREIGN PATENT DOCUMENTS
FR    2 877 770        5/2006
WO    WO 2007/149003 A1    12/2007

OTHER PUBLICATIONS

U.S. Appl. No. 12/466,733, filed May 15, 2009, Thomas, et al.
U.S. Appl. No. 12/168,417, filed Jul. 7, 2008, Collonge, et al.
K. Takeuchi, et al. "A Study of the Threshold Voltage Variation for Ultra-Small Bulk and SOI CMOS", IEEE TED, vol. 48, No. 9, Sep. 2001, 7 Pages.
M. Yamaoka, et al. "Low Power SRAM Menu for SOC Application Using Yin-Yang-Feedback Memory Cell Technology", Symposium on VLSI Circuits, Digest of Technical Papers, Jun. 2004, 4 pages.
A. M. Ionescu, et al. "Modeling and Design of a Low-Voltage SOI Suspended-Gate MOSFET (SG-MOSFET) with a Metal-Over-Gate Architecture", IEEE International Conference Symposium on Quality Electronic Design, 2002, 6 Pages.

(Continued)

Primary Examiner—Huan Hoang
Assistant Examiner—James G Norman
(74) Attorney, Agent, or Firm—Oblon, Spivak, McClelland, Maier & Neustadt, L.L.P.

(57) ABSTRACT

The present application relates to a non-volatile random-access memory cell equipped with a suspended mobile gate and with piezoelectric means for operating the gate.

13 Claims, 21 Drawing Sheets

OTHER PUBLICATIONS

H. Kam, et al. "A New Nano-Electro-Mechanical Field Effect Transistor (NEMFET) Design for Low-Power Electronics", IEDM Technical Digest, 2005, 4 Pages.

N. Abelé, et al. "Ultra-Low Voltage MEMS Resonator Based on RSG-MOSFET", MEMS, 2006, pp. 882-885.

N. Abelé, et al. "1T MEMS Memory Based on Suspended Gate MOSFET", IEDM, 2006, 4 Pages.

Asghar Ramezani, et al., "Influence of van der Waals force on the pull-in parameters of cantilever type nanoscale electrostatic actuators", Microsystem Technologies, vol. 12, 2006, pp. 1153-1161.

W Merlijn van Spengen, et al., "A physical model to predict stiction in MEMS", Institute of Physics Publishing, Journal of Micromechanics and Microengineering, vol. 12, (2002), pp. 702-713.

Y-P. Zhao, et al., "Mechanics of adhesion in MEMS—a review", J. Adhesion Sci. Technol., vol. (17), n°4, pp. 519-546.

Sreedhar Natarajan, et al., "Emerging Memory Technologies—Mainstream or Hearsay?", VLSI Design Automation and Test, 2005, pp. 222-228.

* cited by examiner

NON-VOLATILE SRAM MEMORY CELL EQUIPPED WITH MOBILE GATE TRANSISTORS AND PIEZOELECTRIC OPERATION

TECHNICAL FIELD

The invention relates to the field of static random access memories (SRAM) and to that of non-volatile memories. In particular, it relates to a non-volatile SRAM memory cell structure with variable cell-voltage transistors, in particular equipped with a mobile gate and with piezoelectric operating means adapted to modulate the position of the gate and to maintain a position of the gate after removal of the power supply from the transistors. Such a memory cell can exhibit the performance, in terms of consumption and size, of a conventional SRAM cell, as well as the stored information retention qualities of a non-volatile cell. One advantageous embodiment of the cell results in improved read stability and reduced static consumption.

PRIOR ART

A conventional SRAM memory cell (SRAM) generally has two inverters (10, 11), connected in a so-called "switch" or "flip-flop" configuration, and two access transistors (12, 13) connected to so-called bit lines (15, 16), and controlled by a word line (17) (FIG. 1).

The characteristics looked for in a memory cell are as follows:
  good stability during the various read, write and retention operations, measured respectively by means of a read stability factor (SNM or static noise margin), a write margin factor (WM), and a retention stability factor (RNM or read noise margin),
  a conduction or charge current ($I_{CELL}$) that is as high as possible in order to give the cell a high operating speed,
  a cell size that is as small as possible so as to create a memory with a high cell integration density,
  a retention current ($I_{OFF}$) that is as small as possible in order to minimise the static consumed power.

These criteria are difficult to reconcile, and cause the memory designers to make compromises.

In seeking to progressively reduce the sizes of the transistors in memory cells, the parameters of these transistors fluctuate. As indicated in documents [TAK01] and [YAM04] (referenced at the end of the present description, as are all the other documents mentioned in the present application), this results in an increase in the sensitivity of the memory cells regarding the different sources of noise, such as capacitive coupling, inductive coupling, or power supply noise. The read and write margins are increasingly smaller, thus limiting the possibility of reducing the area of the memory cells.

In addition, the increasing rate of development of multimedia applications, gives rise to a need to create non-volatile memory circuits with improved performance. Among the existing non-volatile memories, one can mention memories of the "Flash" type or the "phase-change" (PCM) type for example. Document [NAT' 05] presents different types of existing non-volatile memory cells for example.

The main drawback of the current non-volatile memories concerns their inadequate performance in terms of read and write speed.

There is therefore the problem of finding a new, non-volatile, memory-cell structure with improved stability and electrical performance, and of equivalent or improved size, in relation to a conventional SRAM device.

DISCLOSURE OF THE INVENTION

The present invention relates to a non-volatile random-access memory cell, including: at least a first plurality of transistors forming a switch, the transistors of the first plurality of transistors including, respectively: a gate dielectric and a mobile gate, suspended above it and disconnected from the gate dielectric, the gate being located at an adjustable distance from the said gate dielectric zone, the transistors also being surmounted by piezoelectric operating means adapted to move the gate in relation to the said channel zone.

The piezoelectric operating means can include a stack formed of at least one layer of piezoelectric material resting on a first polarisation electrode, with a second polarisation electrode resting on the layer of piezoelectric material.

According to an embodiment option, the gate can be attached to the said first electrode.

According to a possible embodiment of the cell, the gate can be in contact with the said first electrode.

According to a possible embodiment, the transistors of the first plurality of transistors can have a source zone connected to the second electrode of their respective piezoelectric operating means.

According to a variant, the transistors of the first plurality of transistors can advantageously have their respective drain zones connected to the second electrode of their respective piezoelectric operating means.

According to a possibility, the transistors of the first plurality of transistors can be adapted, respectively, to adopt: at least a first position in which their gate is located at a first distance from the channel, and to adopt at least a second position in which the gate is located at a second distance from the channel, different from the first distance.

The non-volatile random-access memory cell can also include power supply means adapted to power the transistors of the first plurality of transistors, and their respective operating means. The transistors of the first plurality of transistors can be adapted, respectively, to adopt a given position among the said first and second positions, and also adapted to maintain the gate in the said given position after shut-down or removal of the said power supply means.

The transistors of the first plurality of transistors can be adapted, respectively, to adopt a state in which the piezoelectric operating means are put into a given polarisation state, and in which the gate is maintained in contact with the gate dielectric, achieved using the piezoelectric operating means, the transistors of the first plurality of transistors also being adapted to adopt another state in which the piezoelectric operating means are not polarised, and in which the gate is maintained in contact with the gate dielectric by electrostatic adhesion.

The transistors of the first plurality of transistor can have a variable threshold voltage, which is able to vary by movement of the mobile gate, effected by the piezoelectric operating means.

According to a possibility, the said first plurality of transistors can include:
  a first charge transistor and a second charge transistor,
  a first conduction transistor and a second conduction transistor.

The non-volatile random-access memory cell of the invention is able to adopt several operating modes, at least one of which is a mode for retention of information contained in the cell, at least a mode to read the information contained in the cell, and at least a mode to write information to the cell, the transistors of the first plurality of transistors respectively having a variable threshold voltage.

The invention also relates to an SRAM memory including a plurality of cells as described above.

The invention also relates to a microelectronic device equipped with at least one SRAM memory as described above.

BRIEF DESCRIPTION OF THE DRAWINGS

The present invention will be understood more clearly on reading the following description of examples of embodiment that are given by way of purely indicative and in no way limiting examples, with reference to the appended drawings in which:

FIGS. 6A and 6B illustrate a method for modulating the threshold voltage of a transistor with a mobile gate and piezoelectric operation integrated into a memory cell of the invention, while

Identical, similar or equivalent parts of the different figures carry the same numerical references so as to facilitate the passage from one figure to the next.

The different parts represented in the figures are not necessarily to a uniform scale, in order to render them easier to follow.

DETAILED PRESENTATION OF PARTICULAR EMBODIMENTS

Figure 1:
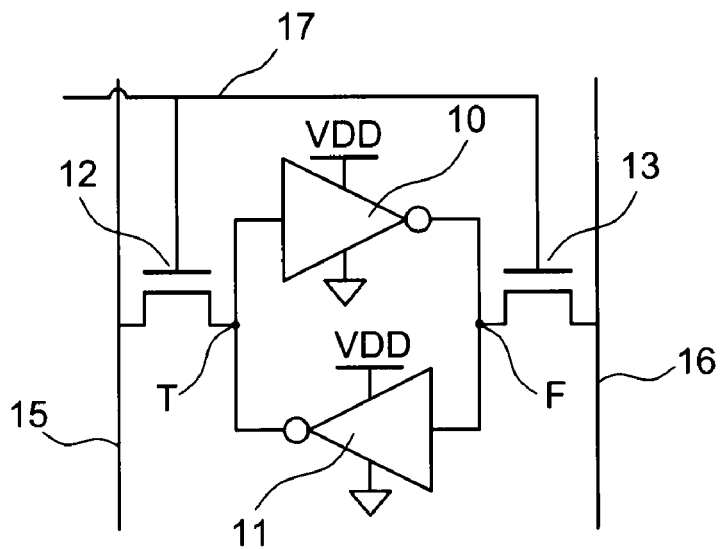
FIG. 1, illustrates an example of a static active memory cell according to the prior art.
Figure 2A:
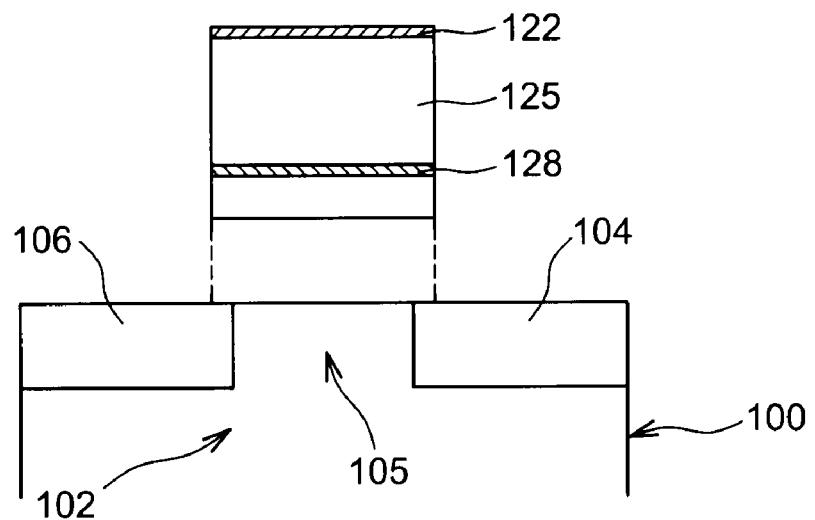
FIGS. 2A and 2B illustrate a transistor forming part of a memory cell of the invention, with a suspended gate, and piezoelectric operating means adapted to move the gate of the transistor in relation to the gate dielectric and to the channel of the transistor.

An example of a transistor forming part of a memory cell of the invention will now be explained with reference to FIGS. 2A and 2B.

This transistor rests on a substrate 100 in which a semi-conducting zone 102, adapted to play the role of an active zone, has been created. The semi-conducting zone 102 includes a source region 104, and a drain region 106 on either side of a channel zone 105 of the transistor. A gate dielectric layer 111 covers the semi-conducting zone 102. The transistor includes a suspended gate 116. The gate 116 is not attached to, or is not joined to, the gate dielectric layer 111.

The device is adapted to adopt at least one position in which the gate 116 is located at a distance from the gate dielectric layer 111, so that a space exists between the gate 116 and the gate dielectric layer 111. The gate 116 and the gate dielectric layer 111 can be separated by a distance $\Delta$ (defined in FIG. 2B in a direction parallel to vector $\vec{j}$ of an orthogonal coordinate system $[0; \vec{i}; \vec{j}; \vec{k}]$) that is variable or adjustable.

The gate 116 is suspended or attached by its upper face to piezoelectric operating means or to a piezoelectric operator. The distance between the gate 116 and the channel 102 can be modulated, and this is effected by the piezoelectric operating means. The piezoelectric operating means are adapted to move the gate 116 in relation to the channel 105 of the transistor. The gate 116 is able to adopt several positions in relation to the channel 105. By piezoelectric operation, is meant a movement of the gate due to a deformation of the piezoelectric layer 125 and of its associated electrodes 122, 128, by reverse piezoelectric effect.

The piezoelectric operating means 120 can include a stack 120 formed of a lower electrode 122 to which the gate 116 can be attached, a layer of piezoelectric material 125 resting on the lower electrode 122, and an upper electrode 128 resting on the layer of piezoelectric material 125.

Figure 2B:
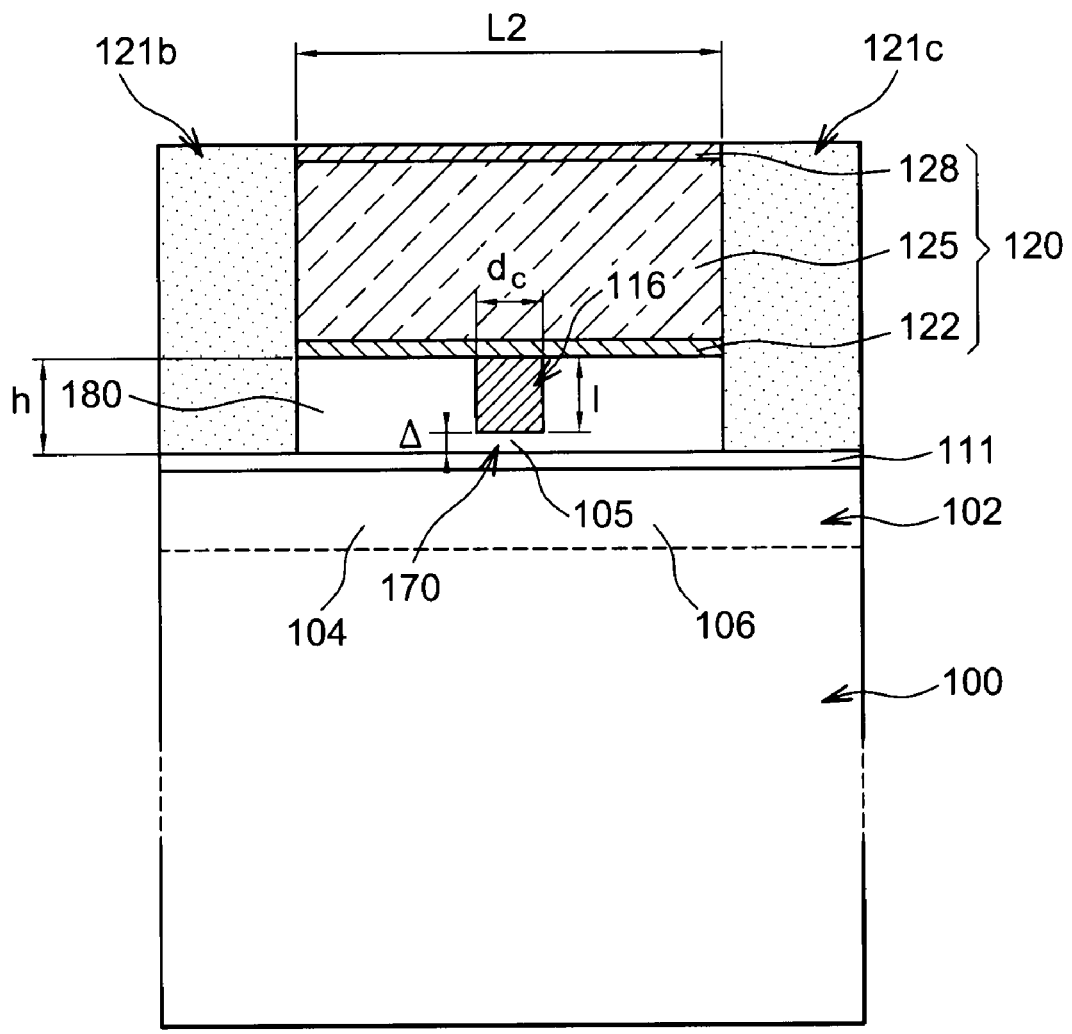

The device can also include one or more elements 121b, 121c supporting the stack 120 of the piezoelectric operator, located around of the latter (FIG. 2B). Studs (not shown in FIGS. 2A-2B) are also provided so as to create the contacts of the transistor. One or more conducting studs can also be provided to create the contacts of the piezoelectric operator. Conducting studs can be provided to respectively connect or electrically link the source zone 104 to the polarisation means of the source, the drain zone 106 to the polarisation means of the drain 106, the gate 116 and the lower electrode 122 of the stack 120 to the polarisation means of the gate and of the lower electrode 122, and the upper electrode 128 of the operator to the polarisation means of the piezoelectric operator.

An example of the operation of a microelectronic device according to the invention will now be given with reference to FIGS. 2A-2B, 3A-3B and 4A-4B.

Figure 3A:
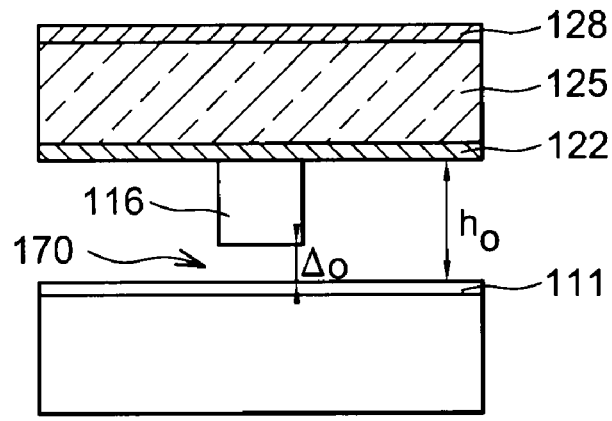
FIGS. 3A and 3B illustrate different positions of a transistor integrated into a memory cell of the invention, and equipped with a mobile suspended gate and piezoelectric means to operate the gate, FIGS. 4A and 4B respectively illustrate steps of adhesion of the gate to the gate dielectric, and of unsticking (pull-off) of the gate from the gate dielectric of the transistor with mobile suspended gate and piezoelectric operation integrated into a memory cell of the invention.

The device can adopt a so-called "rest" position in which the stack 120 is suspended above and at a so-called "rest" height, h0, from the gate dielectric layer 111. In the rest position, the gate 116 is located at a so-called "rest" distance, Δ0, from the dielectric 111, so that an empty space 170 is created between the gate 116 and the gate dielectric zone 111. The piezoelectric layer 125 can be flat in the rest position. In the rest position, the power supply of the operating means and of the transistor are off, so that all of the polarisations are at zero potential (FIG. 3A).

When they are polarised, the piezoelectric operating means can operate the gate 116, and can move the latter. Depending on the direction of the external electric field that is applied to it by means of the electrodes 122, 128, this piezoelectric layer 125 is adapted to shrink or expand, and thus to move the gate 116 that is attached to it.

In addition to the reverse piezoelectric effect, an electrostatic attraction effect arising from the potential difference between the gate 116 and the channel 105 of the transistor is capable of being created. This electrostatic attraction effect manifests itself by an electrostatic force that tends to move the gate 116 toward the channel 105 of the transistor, and that bring about contact between the gate 116 and the gate dielectric 111.

An additional force, known as the adhesion force and also called molecular adhesion, can also be created. Molecular adhesion, in particular of the Van der Waals type, is able to exist between the lower face of the gate 116 and the gate dielectric surface 111. The generation of this additional force depends in particular on the flatness of the lower face of the gate 116 and of the surface facing the gate dielectric 111, as well as on suitable dimensioning of the elements of the structure. Generation of the adhesion force or of molecular adhesion is described in the following documents for example—the article of Asghar Ramezani et al.: "*Influence of Van Der Waals Force on the Pull-In Parameters of Cantilever Type Nanoscale Electrostatic Actuators*", Microsystem Technologies, 2006, vol. 12, pp. 1153-1161; the article of W. Merlijn van Spengen et al.: "*A Physical Model to Predict Stiction in MEMS*", Institute of Physics Publishing, Journal of Micromechanics and Microengineering, 12, (2002), pp. 702-713; and the article of Y.-P. ZHAO et al.: "*Mechanics of Adhesion in MEMS—a Review*", J. Adhesion Sci. TechnoL. Vol. (17), no 4, pp. 519-546. In relation to the other forces to which the gate is subjected, the adhesion force or molecular adhesion increases its influence as the gate gets closer to the gate dielectric.

Generation of the pull-in or molecular adhesion force results in endowing the device with the quality of non-volatile operation. The latter is able to hold itself in a given position when the power supply and the polarisations of the operator and of the transistor are removed. When the polarisations are switched off, the gate 116 is capable of being maintained in contact with the gate dielectric 111. When the transistor is again polarised, it is able to adopt the same mode of operation as that in which it was left before the shut-down of the polarisations.

Figure 3B:
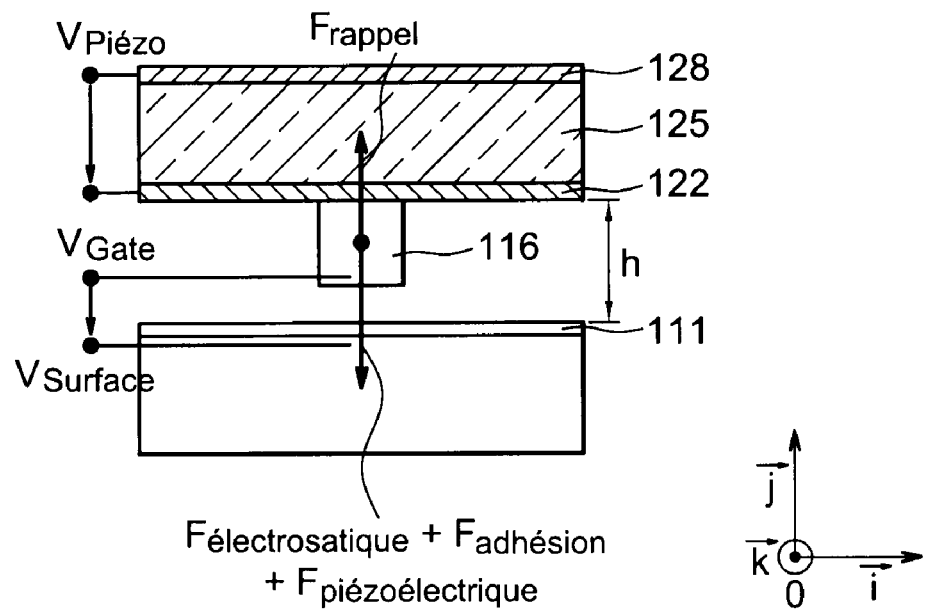
Figure 4A:
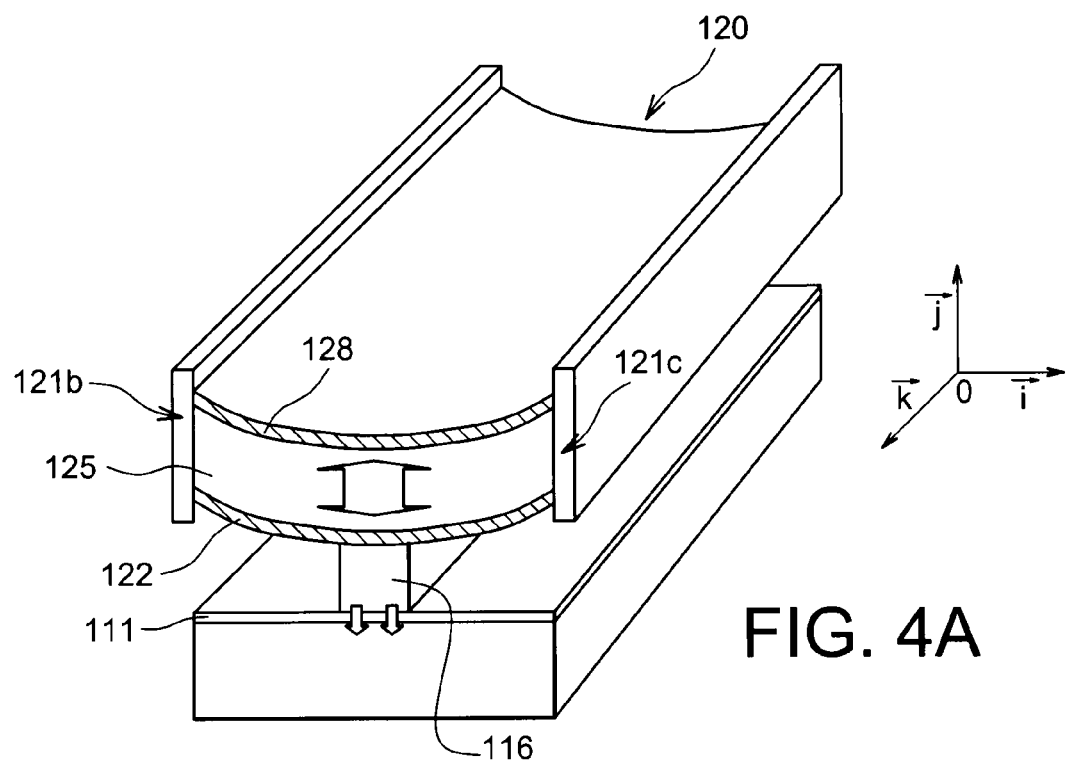
Figure 4B:
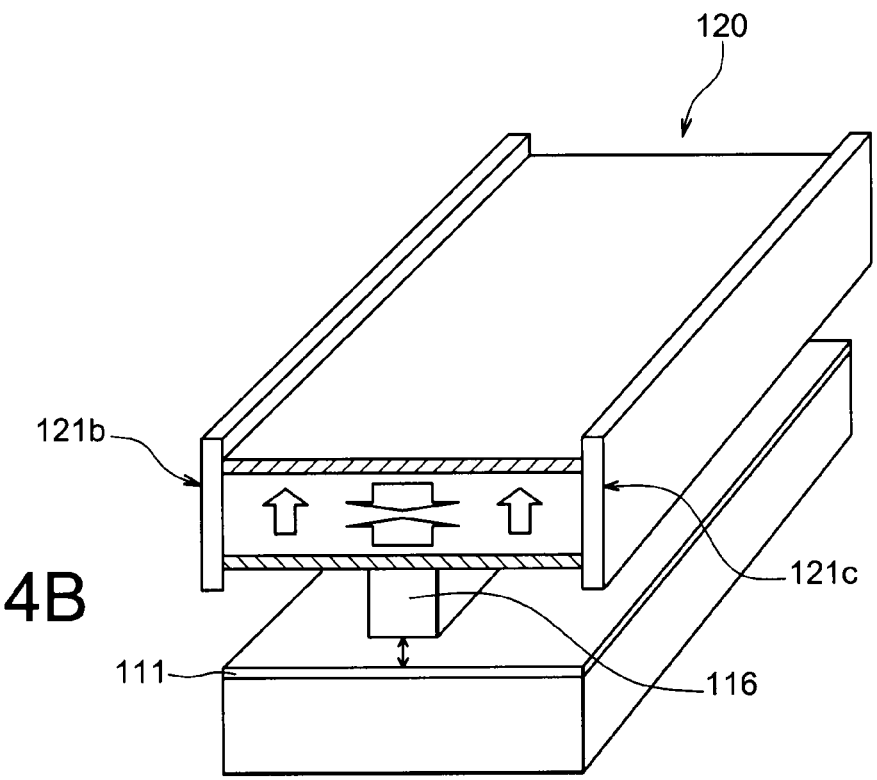

In FIG. 3B, the device is put into a polarisation state that is different from that of the rest position, and for which the device adopts a first position in which the gate 116 is not in contact with the surface of the gate dielectric layer 111, the gate 116 being maintained at a non-zero distance Δ from the gate dielectric layer 111. In order that the device will adopt the first position, the piezoelectric means are placed in a suitable polarisation state, a non-zero potential being applied to the electrodes. The suspended gate 116 of the transistor can then be subjected to four forces, including a first or electrostatic force, $F_{electrostatic}$, due to the potential difference present between the gate and the surface of the channel of the transistor, a second or piezoelectric force, $F_{piezoelectric}$, brought about by the potential difference applied between the two polarisation electrodes 122, 128 of the piezoelectric layer, a third or return force, $F_{return}$, corresponding to the stiffness of the mechanical support of the gate 116, that is to the stiffness of the stack formed of the piezoelectric layer 125 and the electrodes 122, 128, and of the layer or of insulating elements supporting the stack, a force or molecular adhesion, $F_{adhesion}$, resulting in particular from the Van Der Waals forces operating between the lower face of the gate 116 located facing the gate dielectric layer 111 and the surface of the gate dielectric layer 111. In the first position, the polarisation state of the electrodes of the operating means is adapted so that:

$$|F_{electrostatic}|+|F_{adhesion}|<|F_{return}|+|F_{piezoelectric}|$$

A different polarisation of the piezoelectric operating means can move the latter. The fourth force can then become significant when Δ is made small, less than 1 nm for example. Adhesion (FIG. 4A) of the gate 116 onto the dielectric layer 111 can be achieved when the following condition is satisfied:

$$|F_{piezoelectric}|+|F_{electrostatic}|+|F_{adhesion}|>|F_{return}|$$

A predetermined dimensioning of the elements of the device, and suitable polarisation can allow this condition to be met.

In the adhesion position, the gate 116 is in contact with the surface of the gate dielectric 111. When the device is polarised, the gate 116 of the transistor is subjected, in a first approximation, to the four forces presented above for the adhesion mechanism.

Unsticking (FIG. 4B) of the gate 116 occurs when the following condition is met:

$$|F_{piezoelectric}|+|F_{return}|>|F_{electrostatic}|+|F_{adhesion}|$$

Predetermined dimensioning of the elements of the device, and suitable polarisation, can allow this condition to be met.

One may wish to preserve the state of operation of the transistor, even after the shut-down of all the polarisations or power supplies, in order to endow device with non-volatile operation.

To this end, the gate 116 can be maintained, after shut-down of the polarisations, in a position in which it was located before this shut-down. When the polarisations are switched off, the gate 116 is subject only to the return forces of the structure and adhesion to the surface of the gate dielectric 111. The piezoelectric and electrostatic forces that are dependent on the applied potential differences, become zero.

Two cases of preserving the position of the gate 116 can be achieved, for example.

Figure 5A:
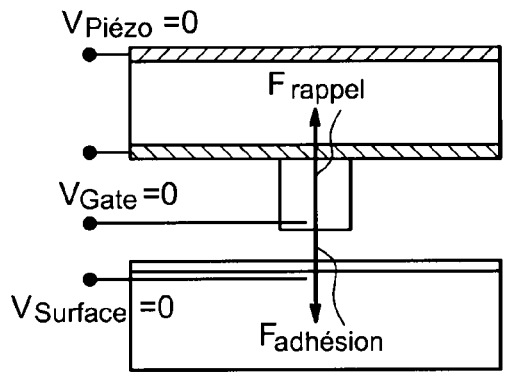
FIGS. 5A and 5B illustrate non-volatile operation of a transistor with mobile suspended gate and piezoelectric operation, integrated into a memory cell of the invention.

A first case in which the gate is initially, pull-back or distanced from the gate dielectric 111, and is located in the first position before removal of the power supply or of the polarisations for example. In this case, after removal, the adhesion forces are low compared to the return forces, which holds the gate 116 in the rest position (FIG. 5A). There can be a small movement of the gate between the first position when the stack is polarised but held at a distance from the gate dielectric, and the "rest" position in which the polarisations are switched off. By a small movement is meant a small movement in relation to the rest distance Δ0.

Figure 5B:
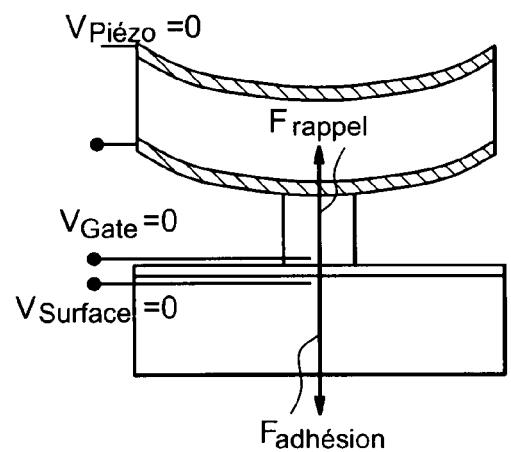

A second case in which the gate 116 is initially adhering to, or in contact with, the gate dielectric 111, 116 before removal of the power supply or of the polarisations. In this case, after removal, the adhesion forces are not negligible compared to the return forces (FIG. 5B). In order to keep the gate adhering without polarisation, the following condition must be satisfied:

$$|F_{adhesion}| > |F_{return}|$$

Predetermined dimensioning of the elements of the device, in particular a suitable stiffness of the stack and of the piezoelectric layer as well as a selected rest distance Δ0 can allow this condition to be met. The piezoelectric operating means, as well as the elements supporting the stack, have suitable dimensions and composition to achieve stiffness at the edge of the stack, which satisfies the condition to maintain the gate in the said second case just given. Thus, when the piezoelectric operating means are not polarised or powered, the gate 116 is able to remain in its position adhering to the dielectric 111, by means of adhesion forces that vary greatly with the distance separating the gate 116 from the gate dielectric 111, more than the return forces. The return forces can be proportional to this distance, while the adhesion forces are inversely proportional to a power of this distance, inversely proportional to the cube of this distance for Van Der Waals forces for example.

An example of the electrical operation of the microelectronic device will now be given with reference to FIGS. 6A-6B and FIG. 6C.

The threshold voltage $V_T$ of the transistor can be modulated by varying the thickness of the insulation between the gate 116 and the channel 105 of the transistor.

Figure 6A:
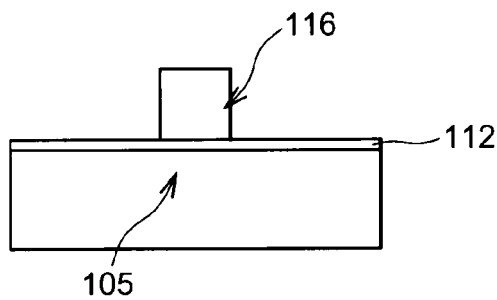

In FIG. 6A, the gate 116 of the transistor is adhering to or is in contact with the gate dielectric 111. The thickness of the insulation between the gate 116 and the channel 105 is thus the thickness $e_1$ of the gate dielectric layer. In this position, the transistor has a first threshold voltage of $V_{T1}$.

Figure 6B:
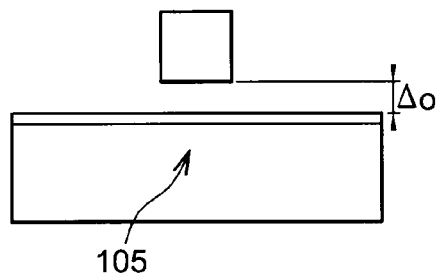

In FIG. 6B, the gate 116 of the transistor is located at a distance Δ from the gate dielectric 111, 116. The thickness of the insulation between the gate 116 and the channel 105 is the thickness of the gate dielectric layer added to a thickness Δ of air between the gate 116 and the gate dielectric 111. In this position, the transistor has a second threshold voltage $V_{T2}$.

The transistor can have at least two separate values of threshold voltage:
  a low threshold voltage $V_{T1}$ when the gate is in contact with the surface of the gate dielectric (gate adhering),
  a high threshold voltage $V_{T2}$ when the gate is not in contact with the surface of the gate oxide (gate pull-back).

The transistor of the device has a threshold voltage that can be modified dynamically, and have such a first threshold voltage $V_{T1}$ for example, that can be low for example when the transistor is in the conducting state and a second threshold voltage $V_{T2}$ for example, such that $V_{T2} > V_{T1}$, and that can be high when the transistor is in the cut-off state. The electrical performance of the transistor is thus improved in relation to a conventional MOS transistor of the same dimensions, to the extent that, in relation to such a transistor, the transistor of the invention has a larger current $I_{ON}$ flowing in the channel in the conducting state, and a smaller channel current $I_{OFF}$ in the cut-off state.

Figure 6C:
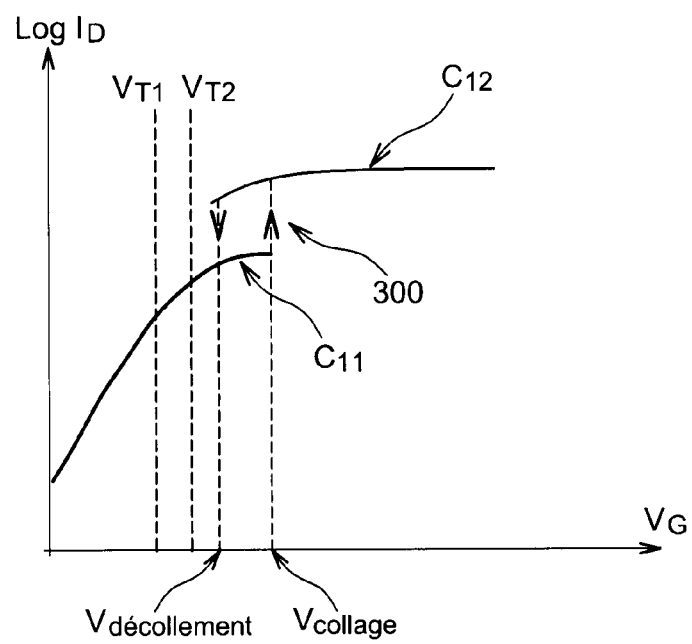
FIG. 6C, illustrates a drain-current/gate-voltage characteristic of a transistor of the invention, FIGS. 7A to 7J, in a cross-section view, illustrate steps of an example of a method for the creation of a microelectronic device according to the invention, while FIGS. 8A to 8E, in a view from above, illustrate steps of this method, FIGS. 9A to 9D, in a cross-section view, illustrate steps of a variant of the method for the creation of a microelectronic device according to the invention, while FIGS. 10A to 10C, in a view from above, illustrate different steps of this method variant, FIGS. 11A to 11C, in a cross-section view, illustrate steps of another method variant for the creation of a microelectronic device according to the invention, while FIGS. 12A to 12B, in a view from above, illustrate steps of this other method variant.

A characteristic curve representing the drain current as a function of the potential applied to the gate is given in FIG. 6C.

A first portion of the curve $C_{12}$ is a position in which the gate is adhering to the gate dielectric 111, while another portion of the curve $C_{11}$ is a position in which the gate is pull-back or in the rest position.

Such a device is capable of operating at variable threshold voltage and thus can have a slope under a threshold that is less than the limit of 60 mV/dec of the conventional architecture of MOS transistors with single or double gates.

An example of a method for the creation of a microelectronic device as described above, equipped with a transistor that has a suspended gate and surmounted by piezoelectric operating means, will now be given with reference to FIGS. 7A-7J and 8A-8E (the device being created is shown in a cross-section view in FIGS. 7A-7J and in a view from above in FIGS. 8A-8E).

In this example, the initial material is a substrate of the semiconductor on insulation type, such as a "Silicon On Insulator" substrate (SOI). The method of the invention is not limited to such a substrate and can be adapted for creation on a solid substrate or on a strained substrate for example. The initial substrate can be formed from a layer 200 of semiconductor material, of the single-crystal silicon type for example, surmounted by a layer 201 of insulating material such as silicon oxide, on which rests a fine layer of semiconductor material, such as single-crystal silicon, intended to form an active layer.

In the fine layer of semiconductor material, at least a semi-conducting zone 202 is formed by etching for example.

In this semi-conducting zone 202, it is then possible to create active source zones 204, and drain zones 206, on either side of a channel zone 205.

Next, the semi-conducting zone 202 is covered with a layer that is intended to form a gate dielectric zone 211 surmounted by a first sacrificial layer 213. The first sacrificial layer 213 is intended to be eliminated later in order to separate the future gate of the transistor from the gate dielectric layer 211, and create an empty space between this future gate and the gate dielectric zone 211.

The gate dielectric zone 211 can be based on silicon oxide for example, and created by thermal oxidation of a layer of silicon or by deposition of a dielectric material with a high dielectric constant (high k) such as $HfO_2$ or $Al_2O_3$ or $HfSiO_x$. The dielectric zone 211 can have a thickness of between 1 nanometer and 10 nanometers for example, or of the order of 2 nanometers for example.

The sacrificial layer 213 is based on a material that is adapted to be etched selectively in relation to the other materials of the structure. The sacrificial layer 213 is based on a material that is adapted to be etched selectively in relation to the dielectric 211 in particular, and in relation to the future gate. Choice of the material for the sacrificial layer 213 can also be determined as a function of that of the materials of the piezoelectric layer and of the support elements of this layer that are intended to be created later, so that they can be etched selectively in relation to this piezoelectric layer and these support elements.

Figure 7A:
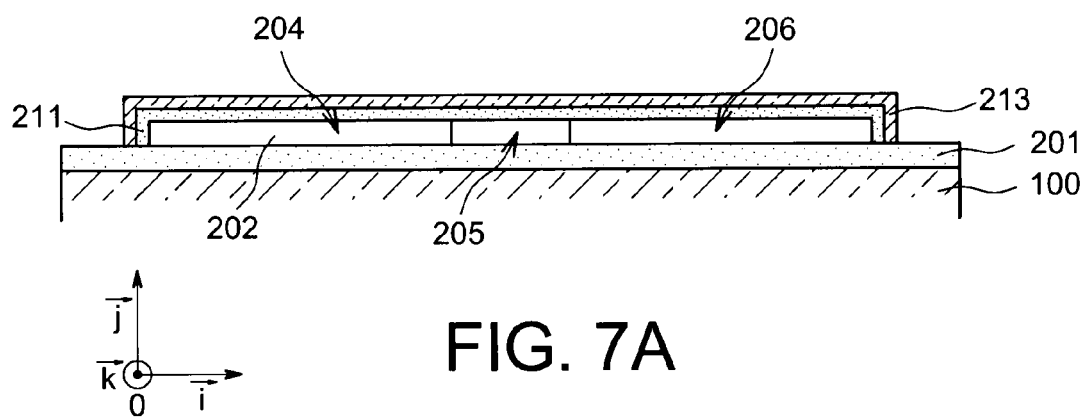

The first sacrificial layer 213 can be based on Ge or SiGe for example. According to another example, the first sacrificial layer 213 can be based on $SiO_2$ in the case where the gate dielectric is based on a "high-k" material. The sacrificial layer 213 can have a thickness of between several nanometers and several tens of nanometers for example, or of the order of 4 nanometers for example (FIG. 7A).

By means of deposition, lithography and etching steps, a gate 216 based on at least one metallic gate material, such as TiN for example, or semiconductor material, such as silicon polycrystalline for example, or a stack formed of at least one metallic layer and at least one semi-conducting layer, is then created. The gate 216 can have a thickness of between 10 nanometers and 1 micrometer for example, or of the order of 50 nanometers for example. The gate 216 can have a critical dimension dc of between several nanometers and several hundreds of nanometers for example, or of the order of 40 nanometers for example. (defined in FIG. 7A in a direction parallel to the [0; $\vec{i}$ ; $\vec{k}$] plane of an orthogonal coordinate system [0; $\vec{i}$ ; $\vec{j}$ ; $\vec{k}$])

It is then possible to create extension zones, by ionic implantation for example.

Insulating spacers 217a, 217b are then formed on either side of the gate 216, based on an insulating material such as $SiO_2$ or $Si_3N_4$ for example or a stack of these two materials.

After this, it is then possible to effect doping of the semi-conducting zone 202, by implantation for example, so as to create the source 204 and drain 206 zones.

Figure 7B:
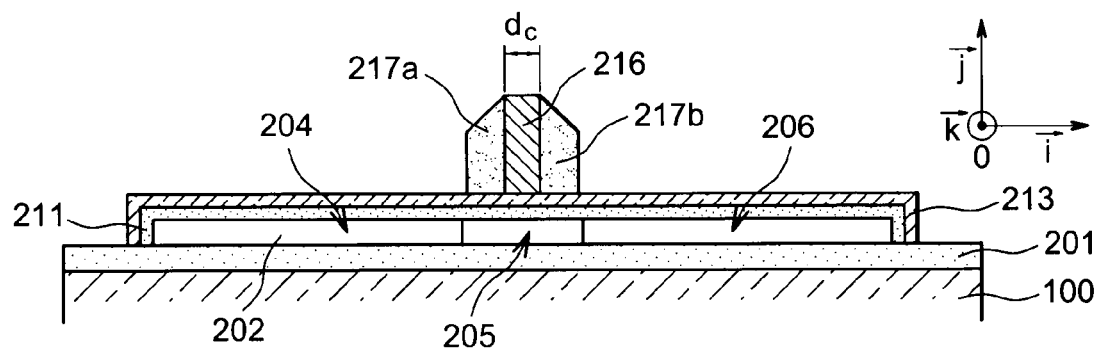

A structure has then been formed that is identical to the structure of an MOS transistor in SOI technology, but with a sacrificial layer 213 between the gate dielectric zone 211 and the gate 216 (FIG. 7B).

The structure is then covered with a second sacrificial layer 219. This second sacrificial layer 219 can be achieved by deposition, and then removed into a zone located above the gate 216. Removal of the second sacrificial layer 219 from above the gate can be effected by Chemical Mechanical Planarisation (CMP) until the upper face of the gate 216 is exposed. The second sacrificial layer 219 can be based on a material that is adapted to be etched selectively in relation to the other materials of the structure. The second sacrificial layer 219 can be based on a material that is adapted to be etched selectively in relation to the gate dielectric 211 in particular, and also in relation to the future gate. The choice of the material of the second sacrificial layer 219 can also be determined as a function of that of the materials of a piezo-electric layer and of the support elements of this piezoelectric layer, intended to be created later, so that they can be etched selectively in relation to this piezoelectric layer and these support elements. The second sacrificial layer 219 can be based on Si for example. According to a possibility, the sacrificial layer can be based on the same material as the first sacrificial layer, based on SiGe or Ge for example. The second sacrificial layer 219 can possibly be based on $SiO_2$, particularly in the case where the gate dielectric is based on a "high-k" material.

Figure 7C:
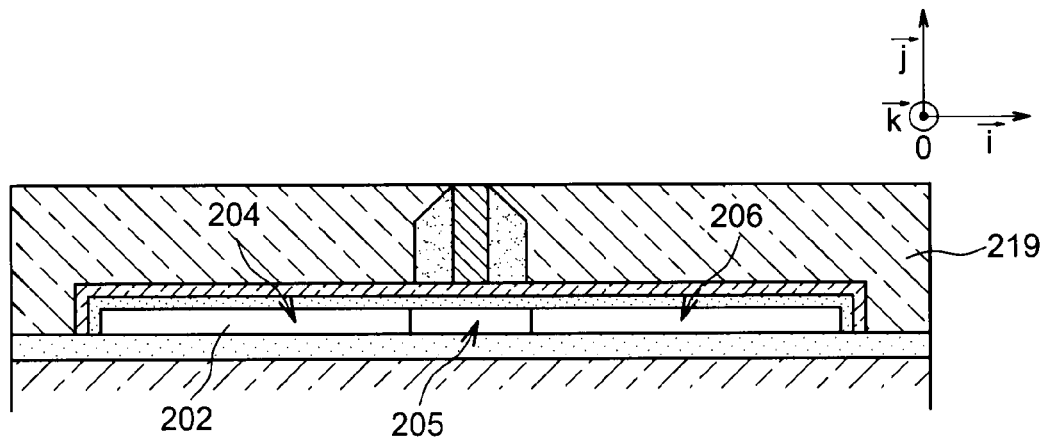
Figure 7D:
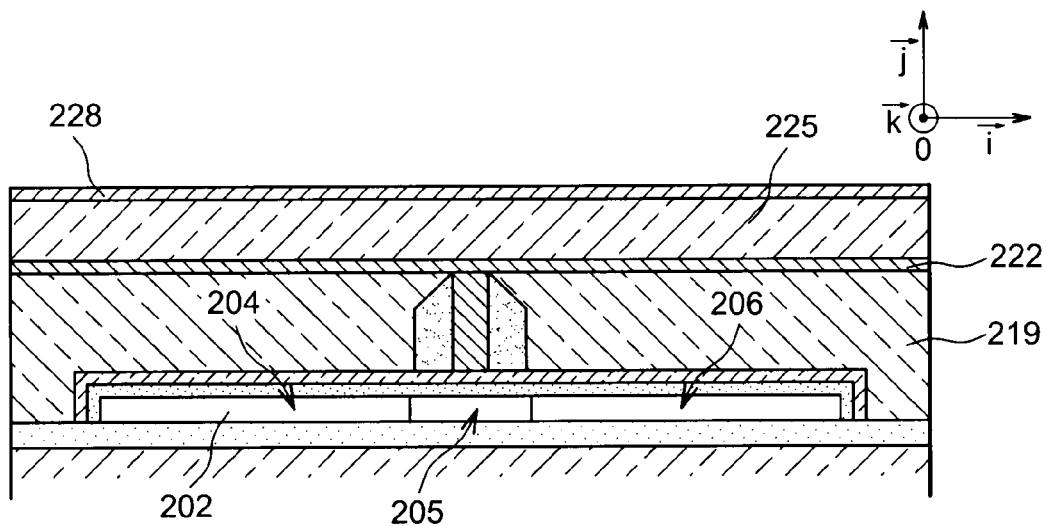

The second sacrificial layer 219 can be based on the same material as the first sacrificial layer 213 (FIG. 7C).

A layer stack is then deposited, from which piezoelectric operating means are intended to be formed.

This stack can be formed of a layer 225 based on a piezo-electric material as such as AlN, PZT, $LiNbO_3$ or $LiTaO_3$, PMN-PT, $LiNbO_3$, or $LiTaO_3$ for example, inserted between two conducting layers 222, 228 that are intended to play the role of electrodes for polarisation of the piezoelectric layer 225.

The conducting layers 222, 228 can be formed of a metallic material, chosen as a function of the material employed for the piezoelectric layer 225, and that can be Mo, Ti or Pt for example. For its part, the piezoelectric layer 225 can be created by deposition of a piezoelectric material or by attachment of this material onto the conducting layer 222, using an adhesion mechanism. Such a process can be used advantageously to form a layer of single-crystal piezoelectric material.

Choice of the material of the conducting layers 222, 228 and of the material of the piezoelectric layer 225 is effected so as to render optimal the piezoelectric properties, and in particular the ability of the layer 225 to deform under the action of an electric voltage, preferably low or as low as possible, applied by the electrodes.

In a case where the piezoelectric material of the layer 225 is AlN for example, the conducting layers 222, 228 can be based on Mo.

The layer of piezoelectric material can have a thickness of between 100 nanometers and 1 micrometer for example, or of the order of 150 nanometers for example. For their part, the conducting layers 222, 228 can have a thickness of between 10 nanometers and 100 nanometers for example, or of the order of 10 nanometers for example.

Next, at least one pattern is created, by photolithography and etching of the layer stack 222, 225, 228 and of the second sacrificial layer 219 for example, so as to form a block in which a lower electrode 222a, a block of piezoelectric material 225a on the lower electrode, and an upper electrode 228a on the block 225a of piezoelectric material, are created. The block formed can have a rectangular pattern of width W and of length L (the length L being defined in FIG. 7D in a direction parallel to vector $\vec{i}$ of the orthogonal coordinate system [0; $\vec{i}$ ; $\vec{j}$ ; $\vec{k}$]).

Next, at least one insulating layer 231 is formed on the structure, based on $SiO_2$ or $Si_3N_4$ for example, or a stack of insulating layers, formed of a fine layer based on $Si_3N_4$ for example, covered by a layer based on $SiO_2$.

A portion of this insulating layer 231 or of this stack is removed by etching for example, in a zone located above the upper electrode 228a.

The remaining portions of the insulating layer 231 surround the transistor as well as the stack with the piezoelectric block 225a and the electrodes 222a, 228a. The remaining portions of the insulating layer 231 thus form a support or reinforcing element, adapted to support the layer stack 222a, 225a, 228a of the piezoelectric operator. The material of the insulating layer 231 can be chosen so as to have a rigidity that is greater than that of the piezoelectric material 225, in order to favour the movement of the gate induced by the deformation of the piezoelectric layer.

Next comes the formation (FIGS. 7E and 8A), on either side of the gate of the transistor, by photolithography and through layer stack 228a, 225a, 222a, the sacrificial layers 219, 213, and the gate dielectric zone 211, of openings 233, 235 that respectively expose the source zone 204 and the drain zone 206 formed in the semi-conducting zone 202. At least one opening 237 is created through layers 228a, 225a and 222a, so as to expose the gate 216 or the first conducting layer 222.

Figure 7E:
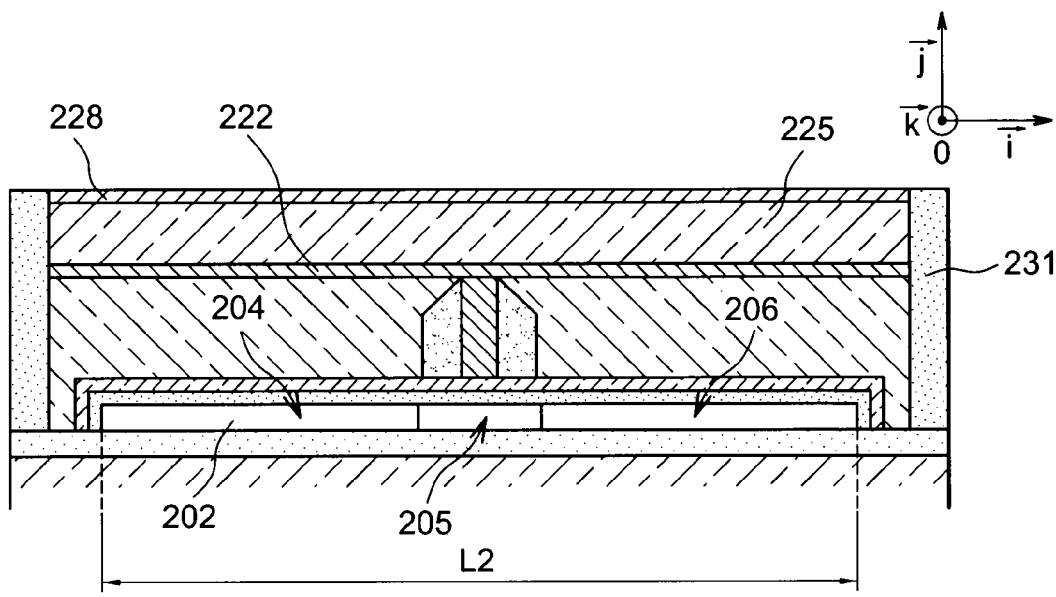
Figure 7F:
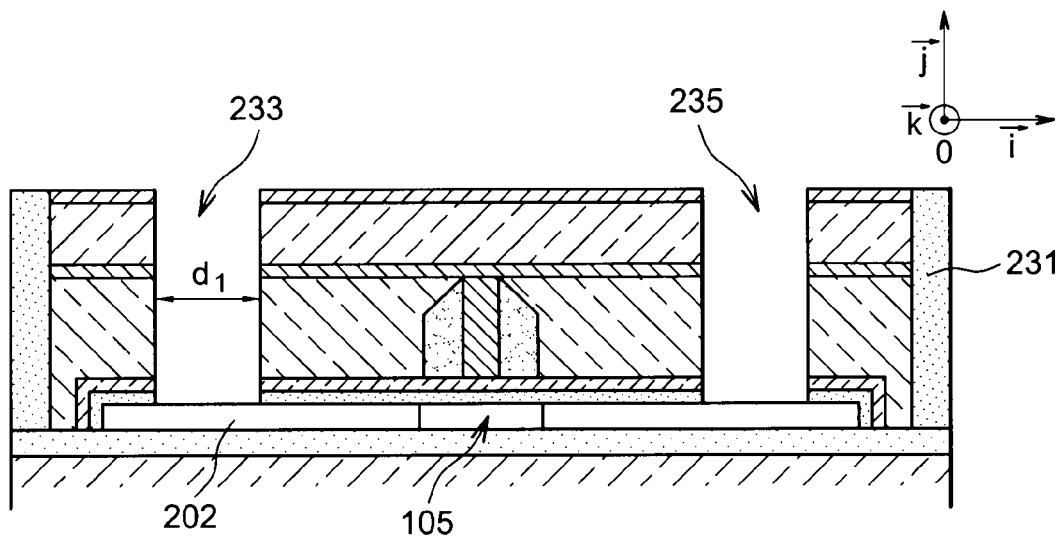

The openings 233, 235, 237, can be adapted with a critical diameter or dimension, d1 (defined in FIG. 7F in a direction parallel to the [0; $\vec{i}$ ; $\vec{k}$] plane).

Figure 7G:
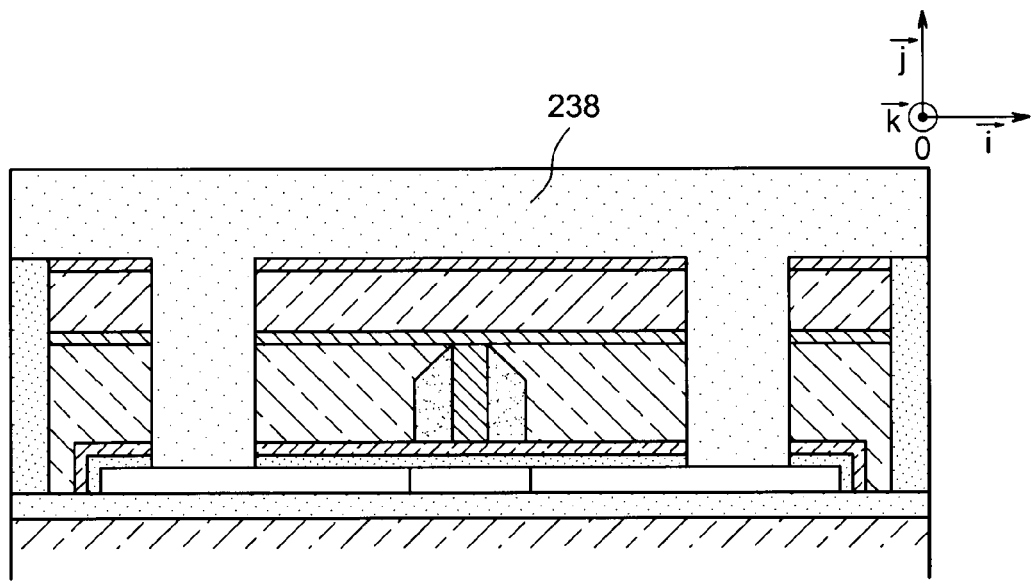

Next comes the filling of the openings 233, 235, 237 by means of an insulating material 238 such as $SiO_2$ (FIG. 7G). It then becomes possible to perform Chemical Mechanical Planarisation (CMP) or polishing of the layer of insulating material 238.

Figure 7H:
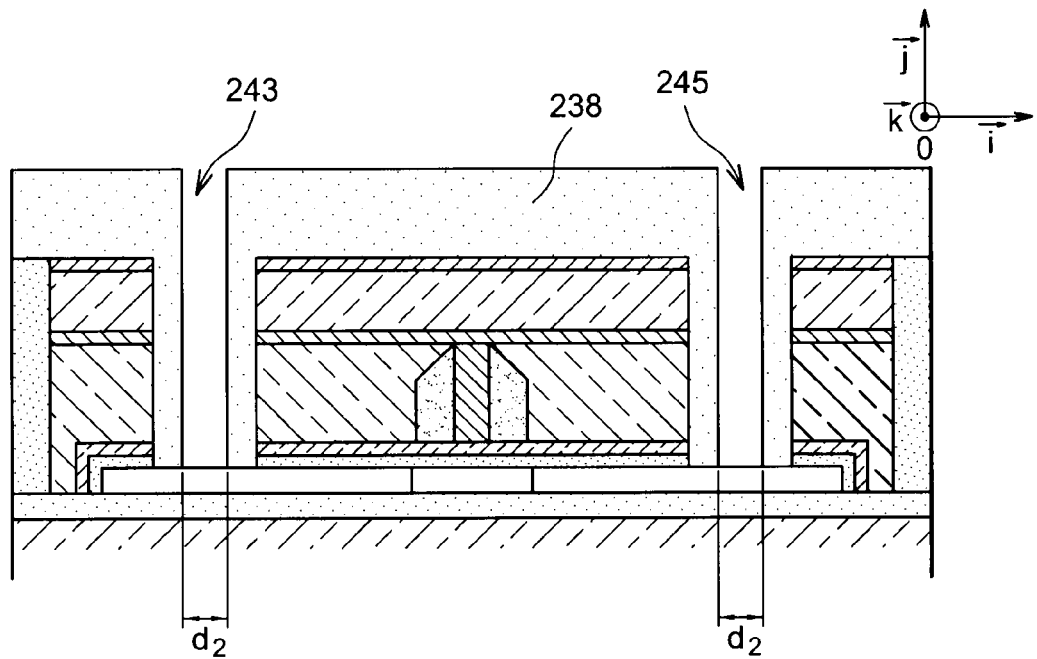

In the openings 233, 235, 237 filled with insulating material 238, holes 243, 245, 247 are created with a critical diameter or dimension, d2, (defined in FIG. 7H in a direction parallel to the [0; $\vec{i}$ ; $\vec{k}$] plane) that is less than that d1 of openings 233, 235 and 237. These holes 243, 245, 247 respectively expose the source zone 204, the drain zone 206, and the gate 216 or the first conducting layer 222 (FIG. 7G).

A hole 249 exposing the upper electrode 228a is also created.

Figure 7I:
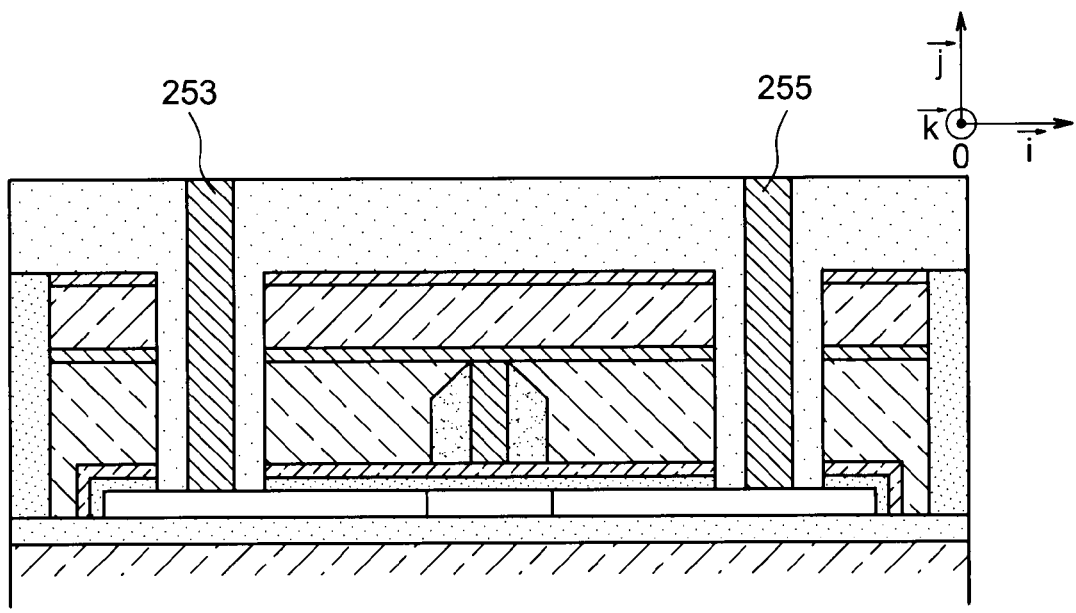
Figure 8A:
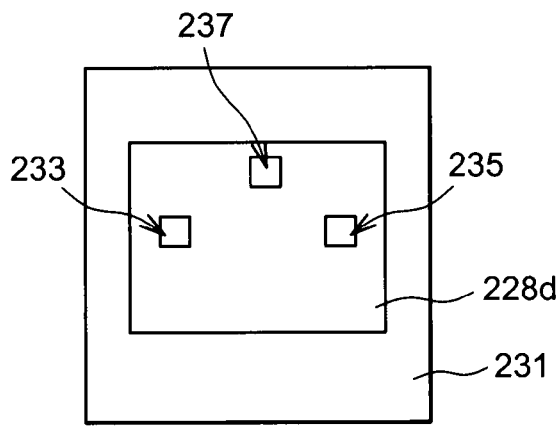
Figure 8B:
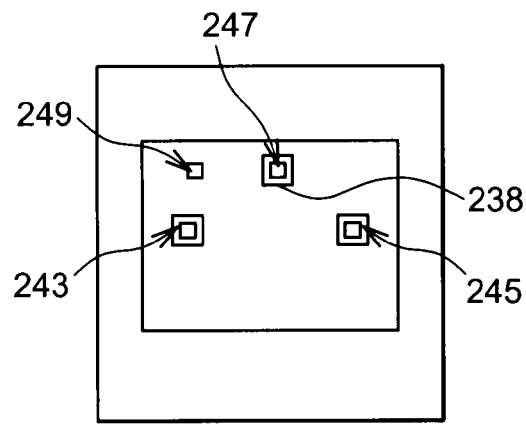
Figure 8C:
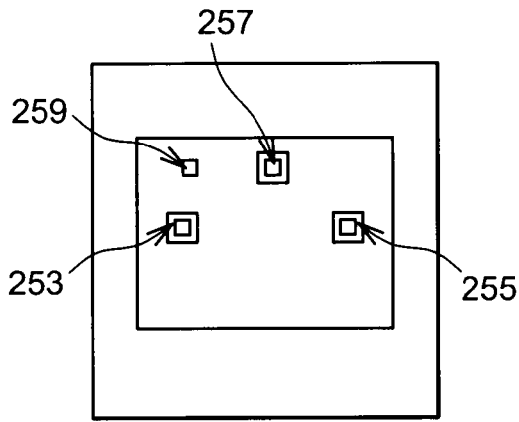
Figure 8D:
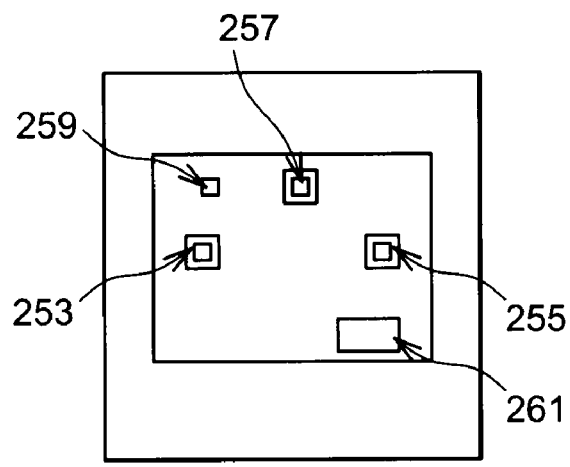

Holes 243, 245, 247, and 249 are then filled by means of at least one conducting material, such as a metal like tungsten, so as to form conducting studs 253, 255; 257, 259 in the holes 243, 245, 247, 249. The conducting studs 253, 255, 257, 259 are respectively in contact with the source zone 204, the drain zone 206, the gate 216 or the lower electrode 222a, and with the upper electrode 228a (FIGS. 7I and 8C).

At least one opening 261 is then created in the block, passing through the stack 220 and the sacrificial layers 213, 219. The opening 261 can be created by means of photolithography and etching steps (FIG. 8D) for example.

Next, a partial or total removal (FIG. 7J) of the sacrificial layers 213, 219 is effected so as to separate the gate 216 from the gate dielectric 211. The removal of the sacrificial layers 213, 219 can be achieved by relocated plasma etching for example, with the plasma being formed in a given chamber and then relocated into another chamber in which the device with the sacrificial layers to be removed is placed.

The removal of the first sacrificial layer 213 is effected so as to create a space 270 between the gate 216 and the gate dielectric layer 211. This removal can be achieved by selective etching of the first layer in relation to the gate, of the gate dielectric. Removal can be achieved by selective etching of a first sacrificial semi-conducting layer for example, in Si for example, in relation to a gate in Ti, of a gate dielectric based on $SiO_2$ Etching can also be selective in relation to the spacers and/or the support elements when they are based on $Si_3N_4$ for example.

The second sacrificial layer 219 can also be removed so as to form a space around or right around the gate 216. Removal can be achieved by selective etching of the second layer in relation to the gate, of the gate dielectric and of the support elements.

Removal can be effected by selective etching of a first sacrificial layer in SiGe for example, in relation to a gate in Ti, of a gate dielectric based on $SiO_2$ and spacers and/or of support elements based on $Si_3N_4$.

Figure 7J:
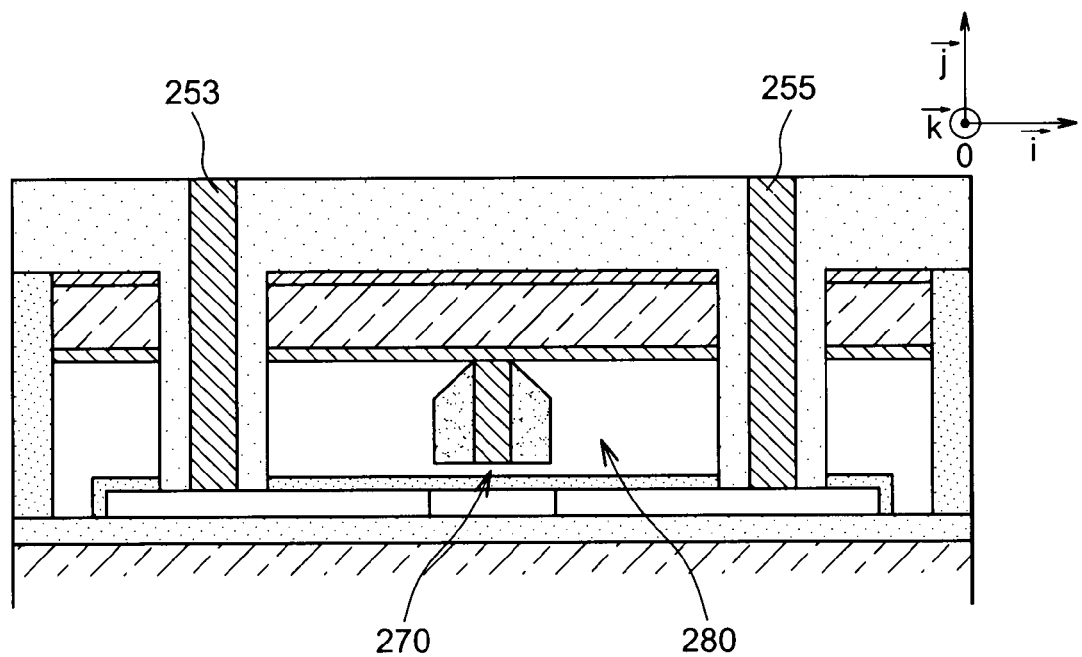

In the case where the two sacrificial layers 213 and 219 are based on the same material, then removal of the two sacrificial layers 213 and 219 can be achieved at the same time. For its part, removal, possibly total, of the second sacrificial layer 219 can be effected so as to create a cavity 280 around the gate 216. After this step for removal of the sacrificial layers 213, 219, the gate 216 is maintained or attached by its upper face to the lower electrode 222a of the operator (FIG. 7J).

In the exemplary embodiment just given, the upper electrode 228a resting on the piezoelectric layer 225 is connected or electrically linked to none of the source contact, drain contact and gate contact studs 253, 255, 257.

If necessary, the upper electrode 228a can be connected or electrically linked later to the source stud 253, or to the drain stud 255, during the later steps of a process that are commonly called the "back-end steps", during which a plurality of metal levels for interconnection of the components of the integrated circuit are created.

According to a possibility, the support layer 231 can again be etched so as to free the sides of the stack formed from the electrodes 222a, 228a and the piezoelectric block 225a. In the case where a rectangular pattern has been formed in the layer stack 222a, 225a, 228a, then etching can be effected so as to free two sides, the two longest sides for example, of the rectangle in order to allow the piezoelectric layer 225a to deform more easily under the action of polarisation.

Figure 8E:
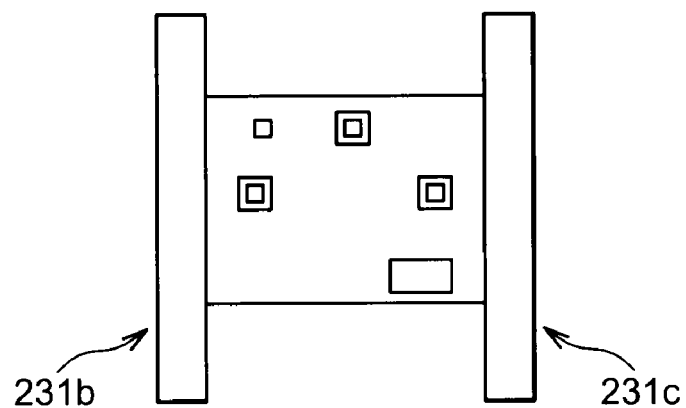

In FIG. 8E, the stack formed from the electrodes 222a, 228a and the piezoelectric block 225a is held in suspension above the substrate 200 by means of two insulating elements or insulating support blocks 231b, 231c formed by etching of the insulating layer 231.

A variant of the method example that has just been described, and in particular of creating the contact studs, will now be given with reference to FIGS. 9A-9D, and 10A-10C (the device being created is shown in a cross-section view in FIGS. 9A-9D and in a view from above in FIGS. 10A-10C).

For this variant, the same steps as those employed in the method example described previously will be used again up to creation of the support layer 231 based on insulating material (up to FIG. 7E inclusive).

Then, on either side of the transistor, using steps of photolithography and etching through the layer stack 228a, 225a, 222a, sacrificial layers 219, 213, the gate dielectric zone 211, openings 333, 335 respectively exposing the source zone 204, the drain zone 206 created in the semi-conducting zone 202, and the gate 216, are formed. At least one opening 337 is also formed to expose the gate zone 216 or the first conducting layer 222a. The opening 333 exposing the source zone 204 can be created with a critical diameter or dimension greater than that of the other openings 335, 337 (FIG. 10A).

Filling of the openings 333, 335 and 337 is then performed by means of an insulating material 238 such as $SiO_2$.

Figure 9A:
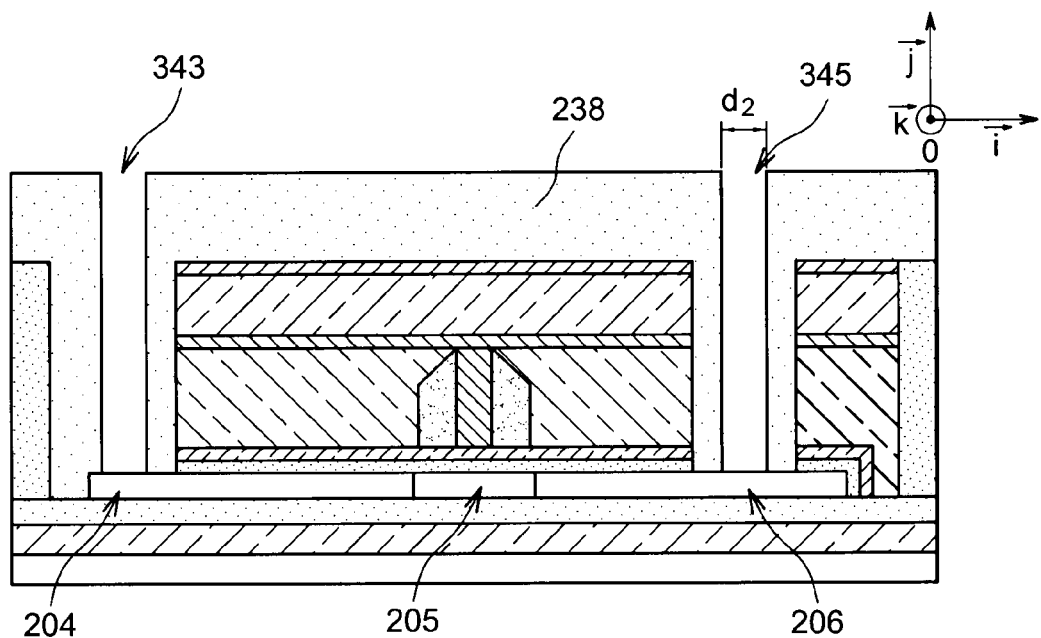
Figure 9B:
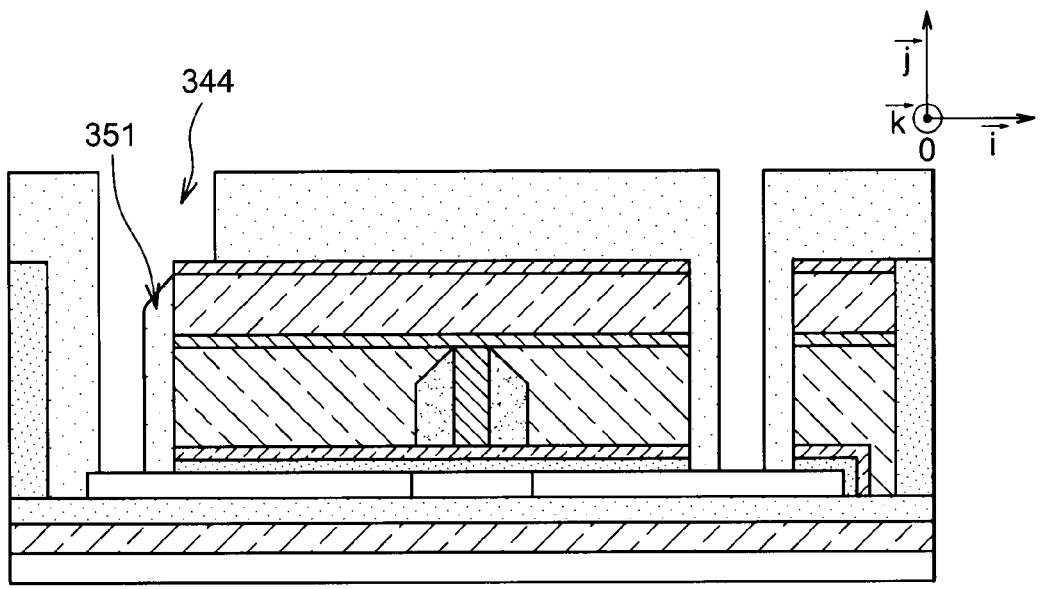
Figure 10A:
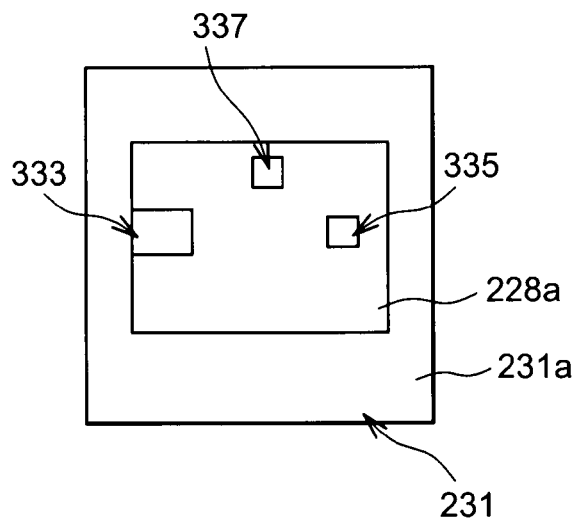
Figure 10B:
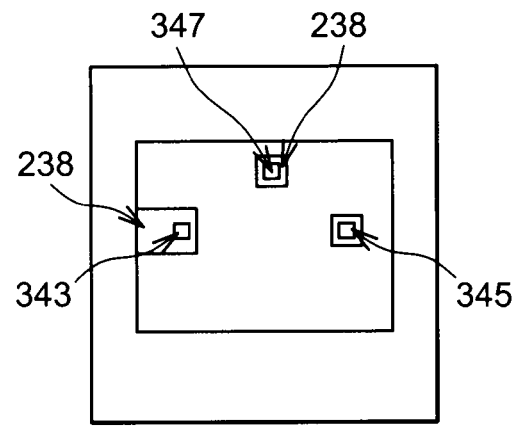
Figure 10C:
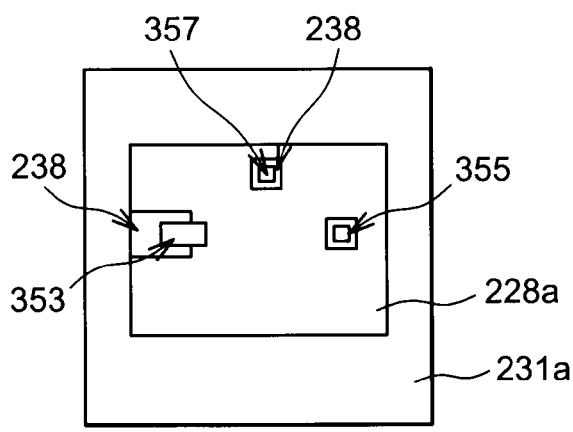

In the openings 333, 335, 337 filled with insulating material 238, holes 343, 345, 347 are created respectively, with a diameter less than that, or with critical dimension d2 that is less than that d1 of the openings 333, 335 and 337 (FIGS. 9A and 10B).

We then widen the mouth 344 of a hole formed facing an active zone such as the mouth 344 of the hole 343 exposing the source zone 204. The mouth of the hole 343 is widened so as to expose part of the upper face of the upper electrode 228a of the piezoelectric operator. This widening is effected so as to preserve an insulating zone 351 or an insulating spacer 351 between the hole 343 and the lower electrode 222a of the operator.

Figure 9C:
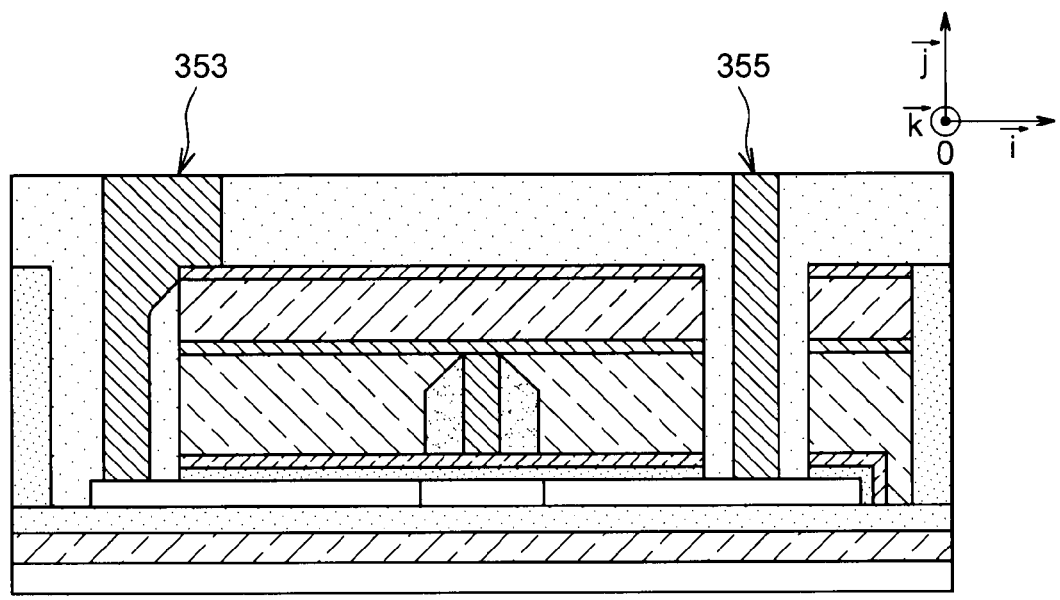

The holes 343, 345, 347 are then filled by means of at least one conducting material, using a metal such as tungsten, so as to form metal studs 353, 355, 357 in the holes 343, 345, 347. The metal studs 355, 357, are respectively in contact with the drain zone and with the gate 216. For its part, the stud 353 formed from the hole 343 with the widened mouth and filled with metal is in contact with the upper electrode 228a and the source zone 204 (FIGS. 9C and 10C).

At least one opening is then formed to expose the sacrificial layers 213, 219. This opening can be created so as to traverse the sacrificial layers 213, 219, or in a variant, can be created at the periphery of the structure, but so as to expose the sacrificial layers 213, 219.

Figure 9D:
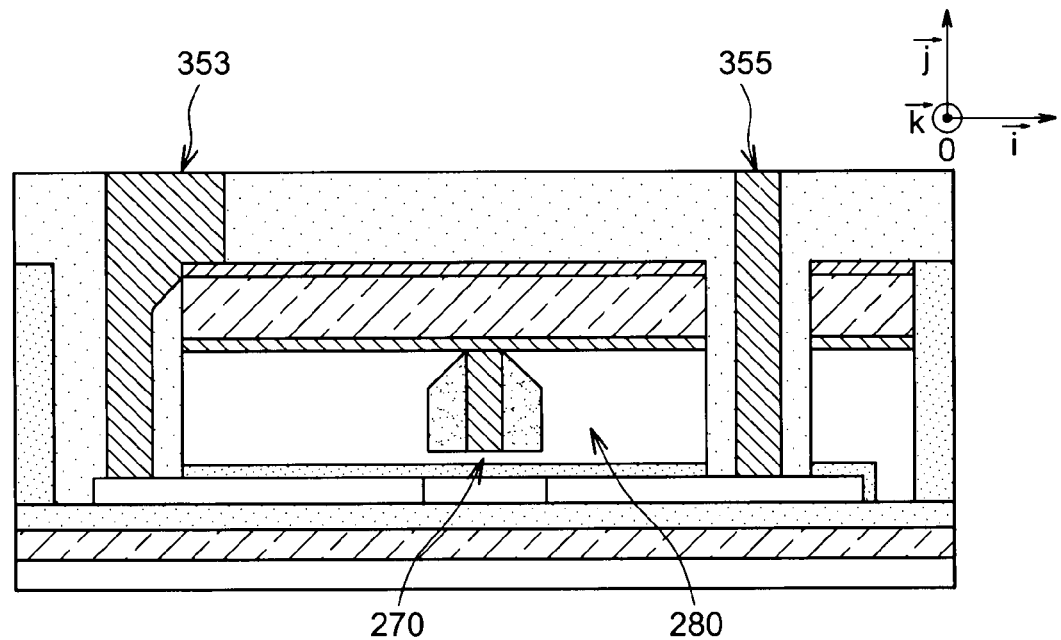

Next, through the opening, etching of the sacrificial layers 213, 219 is effected so as to remove these sacrificial layers 213, 219, and in particular to separate the gate 216 from the gate dielectric 211. A space 270 is thus formed between the gate 216 and the gate dielectric layer 211. A cavity 280 all around the gate 216 can also be formed following removal of the second sacrificial layer 219, by selective isotropic etching for example (FIG. 9D).

According to the variant just given, a stud has been created in contact with the source zone 204 and the second conducting layer 222 of the upper electrode 222a. Using a similar method, it is possible to form a stud in contact with the drain zone 206 and the second conducting layer 222 of the upper electrode 222a.

Figure 11A:
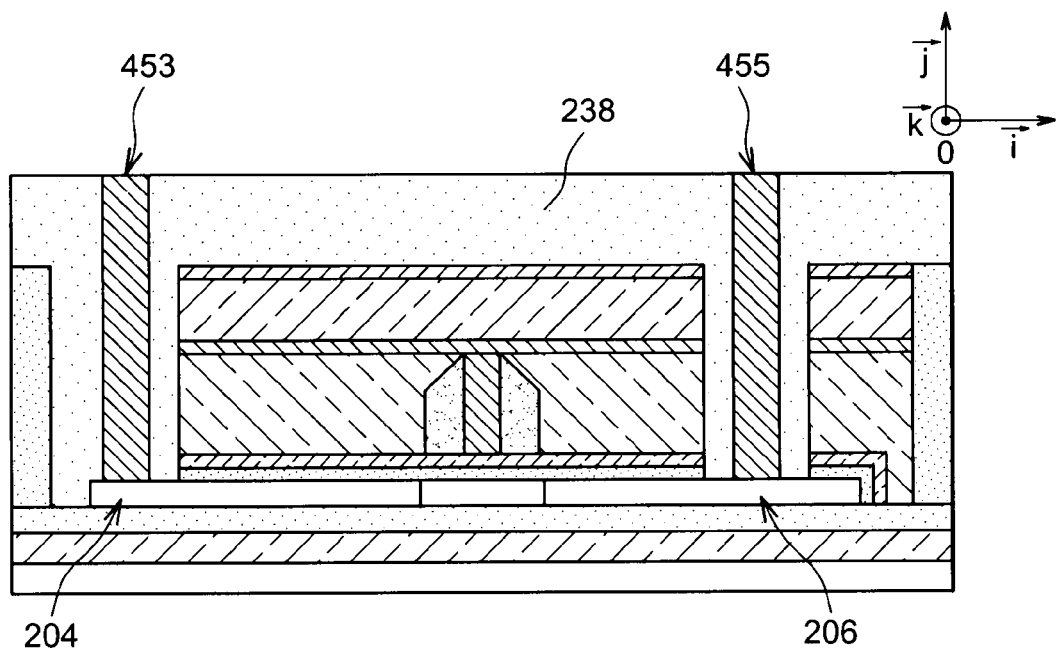
Figure 11B:
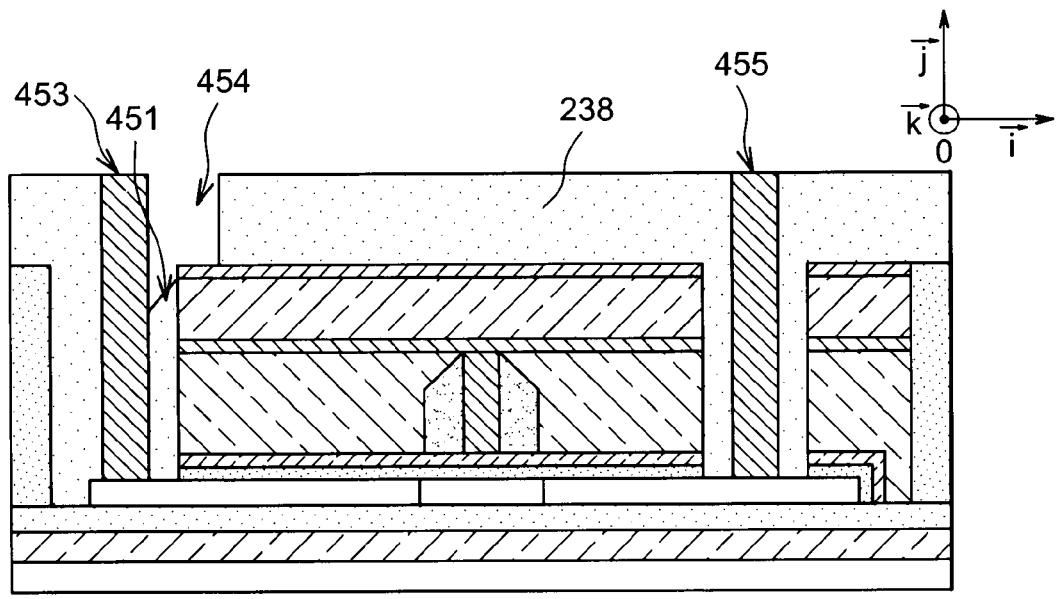

Another embodiment variant of the contact studs will now be given with reference to FIGS. 11A-11C and 12A-12B (the device being created is shown in a cross-section view in FIGS. 11A-11C and in a view from above in FIGS. 12A-12B).

For this variant, the same steps are executed as in the method example described previously, up to creation of the holes 343, 345, 347 with a diameter d2 less than that d1 of the openings 333, 335 and 337.

The holes 343, 345, 347 are then filled by means of a metal such as tungsten, so as to form conducting studs 453, 455, 457 in the holes 343, 345, 347. The conducting studs 453, 455, 457, are respectively in contact with the source zone 204, the drain zone 206, and the gate 216 or the first electrode 222 (FIGS. 11A and 12A).

Close to the stud 453, in contact with the source zone 204, an additional hole 444 is then created in the insulating material 239 so as to expose a portion of the upper electrode 228a and the sides of the stud 453. The additional hole 444 is created so that an insulating zone 459 is preserved between the stud 453 and the lower electrode 222a (FIG. 11B).

Figure 11C:
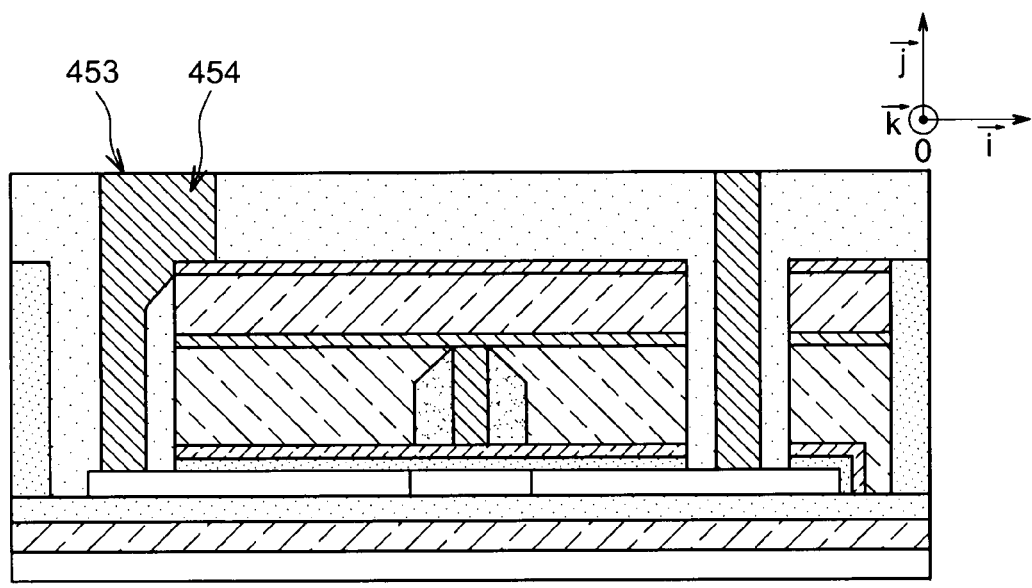
Figure 12A:
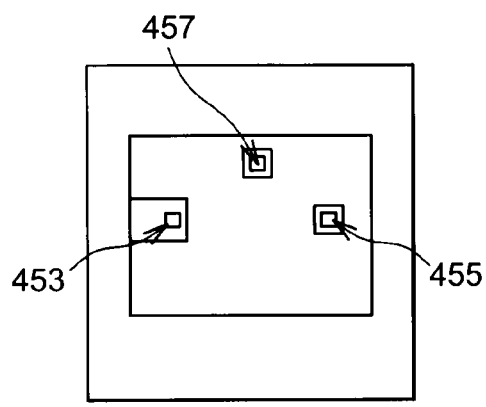
Figure 12B:
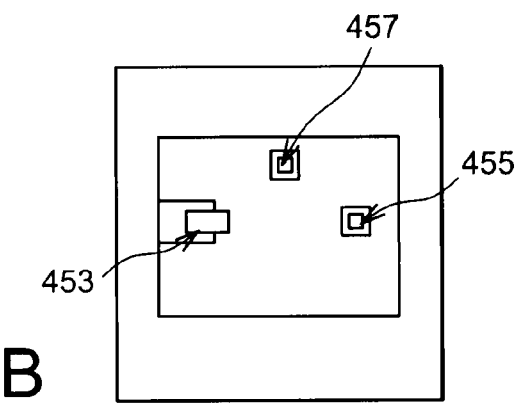

Next, the hole 444 is filled by means of a metal such as tungsten, so as to form a metal zone 454 extending the stud 453, in contact with the upper electrode 228a of the piezoelectric operator (FIGS. 11C and 12B).

As described previously, the steps for creation of at least one opening in the structure, in order to access the sacrificial layers 213, 219, are then executed.

Then, through said opening, etching of the sacrificial layers 213, 219 is performed so as to remove these sacrificial layers 213, 219 and separate the gate 216 from the gate dielectric 211.

The second sacrificial layer 219 can also be removed so as to form a space around or all around the gate 216. In the case where the two sacrificial layers 213 and 219 are based on the same material, then removal of the two sacrificial layers 213 and 219 can be achieved at the same time.

After this step for removal of the sacrificial layers, the gate 216 is maintained or attached by its upper face to the lower electrode 222a of the operator.

According to the variant just given, a stud has been created in contact with the source zone 204 and the second conducting layer 222 of the upper electrode 222a. Using a similar method, one can form a stud in contact with the drain zone 206 and the second conducting layer 222 of the upper electrode 222a.

Figure 13:
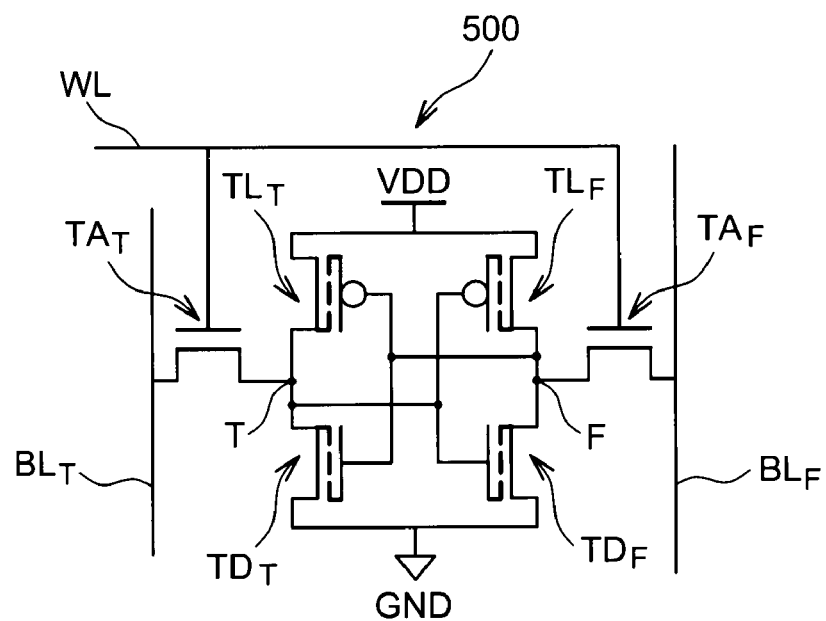
FIG. 13 illustrates an example of the non-volatile SRAM memory cell of the invention, equipped with transistors with suspended gate and with piezoelectric operation of the gate.

A first example of a random-access memory cell 500 according to the invention is illustrated in FIG. 13.

This memory cell 500 is a static SRAM memory cell of the 6T type, that is one which is equipped with 6 transistors. The cell 500 has a first plurality of transistors forming a first inverter and a second inverter connected in a switch configuration or one commonly called a "flip-flop". The first load transistors $TL_T$ and conduction transistors $TD_T$ form the first inverter of the switch, while the second load transistors $TL_F$ and conduction transistors $TD_F$ form the second inverter of the switch.

The first plurality of transistors can be formed from a first charge transistor $TL_T$ and a second charge transistor $TL_F$. The load transistors $TL_T$ and $TL_F$ can be of the P type for example. The cell 500 can also be equipped with a first conduction transistor $TD_T$ and a second conduction transistor $TD_F$ of the N type for example.

The transistors $TL_T$, $TL_F$, $TD_T$, and $TD_F$ of the cell forming the switch are identical that described previously with reference to FIGS. 2A-2B, equipped with a mobile suspended gate and with piezoelectric operating means to move the gate.

The cell also includes access transistors $TA_T$ and $TA_F$ of the NMOS type for example.

The connection in the cell can be similar to those of a conventional 6T memory cell.

In this example, the gate of the second charge transistor $TL_F$ is connected to that of the second conduction transistor $TD_F$ and to a first storage node T of the cell 500. The gate of the first charge transistor $TL_T$ is connected to that of the first conduction transistor $TD_T$ and to a second storage node F.

For their part, the sources of the load transistors $TL_T$, $TL_F$ can be connected together and to a power supply voltage VDD, while the drain of the first charge transistor $TL_T$ is connected to the first node T, the drain of the second charge transistor $TL_F$ being connected to the second node F for its part.

In this example, the load transistors $TL_T$ and $TL_F$ connected to the power supply voltage VDD, have the function of maintaining a logic level '1', equal to voltage VDD for example, at either of the storage nodes T or F such as at the first node T for example, as a function of the logic value stored in the cell 500. The conduction transistors $TD_T$ and $TD_F$ connected to the earth of the cell GND, have the role of maintaining a logic level '0', equal to GND, at either of the storage nodes as a function of the logic value stored.

The two access transistors $TA_T$ and $TA_F$ are provided, according to the manner in which they are polarised, in order to enable access to the potentials of the storage nodes during a read or write cycle, and to block access to the cell 300, when the cell 300 is in a data retention mode.

The first access transistor $TA_T$ and the second access transistor $TA_F$ each has a gate connected to a word line WL. The source of the first access transistor $TA_T$ is connected to a first bit line $BL_T$ while the source of the second access transistor $TA_F$ is connected to a second bit line $BL_F$. For its part, the drain of the first access transistor $TA_T$ is connected to the first storage node T, while the drain of the second access transistor $TA_F$ is connected to the second storage node F.

Operation of the suspended gate of the transistors, $TD_T$, $TD_F$, $TL_T$ and $TL_F$ using piezoelectric means, is used to modulate their threshold voltage $V_T$. As described previously, the piezoelectric operating means are used to endow the cell 500 with non-volatile operation, to the extent that the mobile gate operated by such means is adapted to remain in position, even after removal of the power supply voltage VDD. Thus, after removal of the power supply from the cell 500, the latter can be reinitialised, or returned during its re-start, to the state it was in before removal.

Regarding the connection between the piezoelectric operator and the respective electrodes of the transistors $TD_T$, $TD_F$, $TL_T$ and $TL_F$ two configurations can be implemented.

Figure 14A:
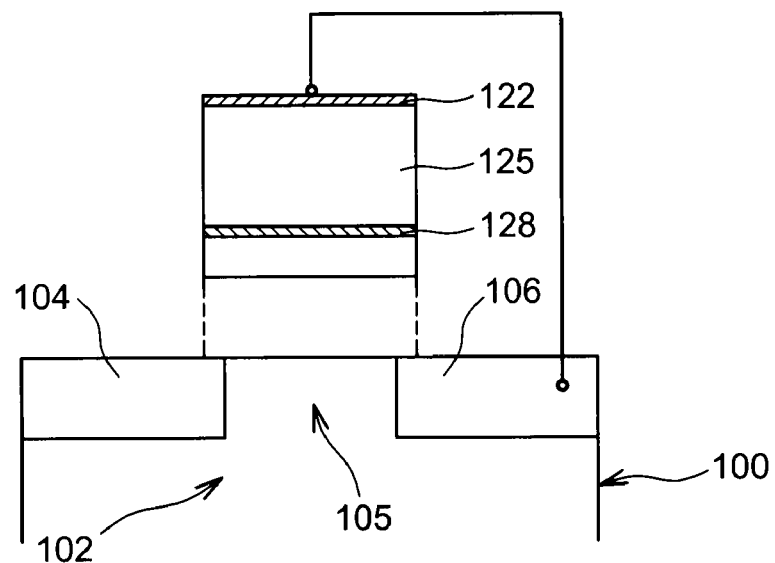
FIG. 14A represents a transistor with suspended gate and piezoelectric operator, in which the source zone is connected to the upper electrode of the piezoelectric operator.

In a first configuration (FIG. 14A), the upper electrode 128 of the piezoelectric operating means and the source 104 of the transistor are connected together.

Figure 14B:
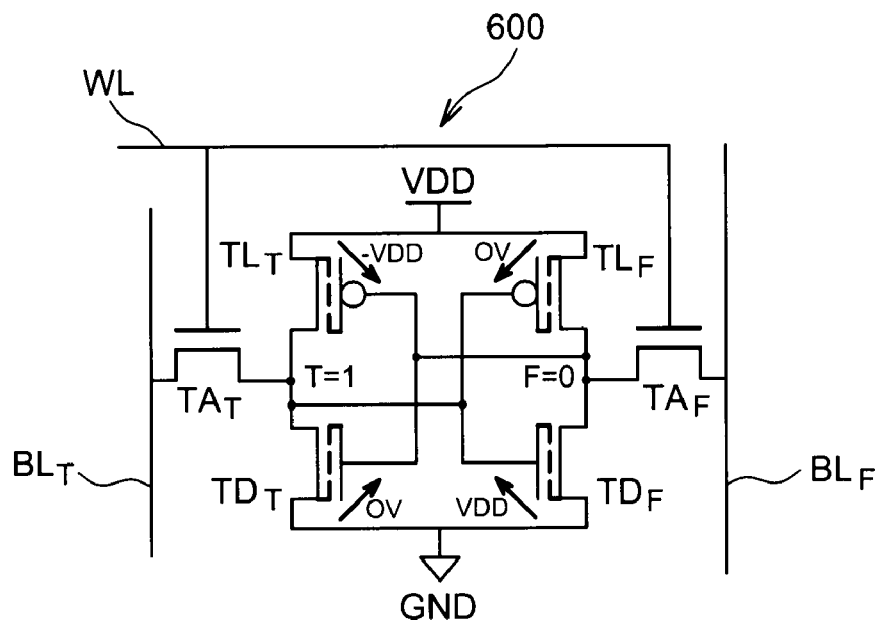
FIG. 14B illustrates an example of a 6T memory cell according to the invention, equipped with transistors such as that illustrated in FIG. 14A.

In FIG. 14B, the transistors $TD_T$, $TD_F$, $TL_T$ and $TL_F$ of a cell 600 similar to the cell 500, have this first configuration.

Figure 15A:
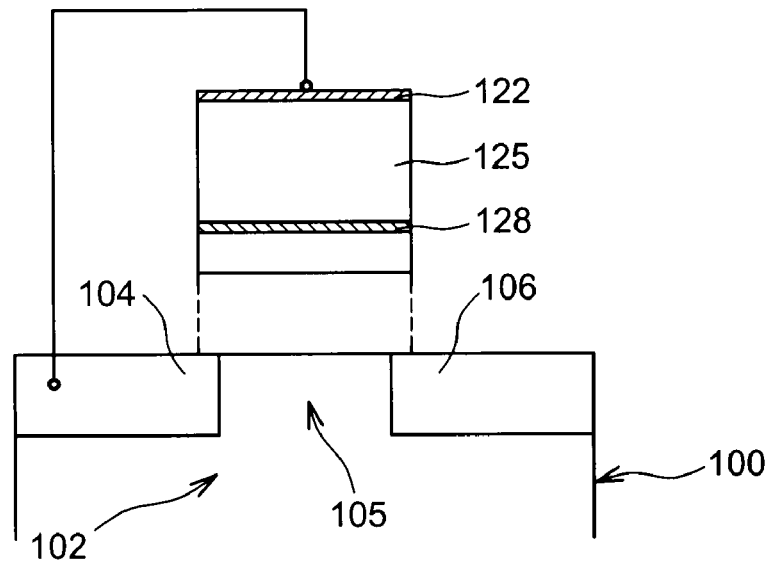
FIG. 15A represents a transistor with suspended gate and piezoelectric operator, in which the drain zone is connected to the upper electrode of the piezoelectric operator.

In a second configuration (FIG. 15A), the upper electrode 128 of the piezoelectric operating means and the drain 106 of the transistor are connected together.

Figure 15B:
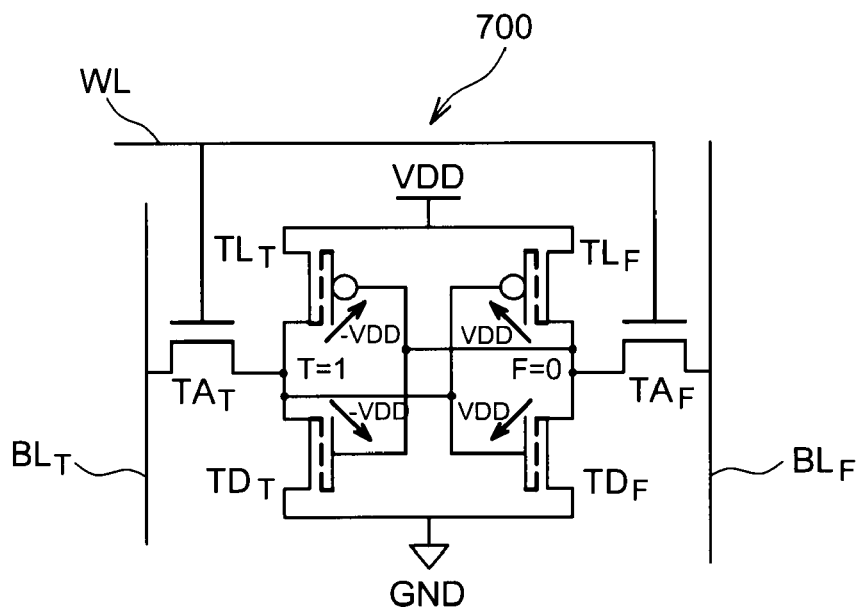
FIG. 15B illustrates an example of a 6T memory cell according to the invention equipped with transistors such as that illustrated in FIG. 14A.

In FIG. 15B, a cell 700 similar to cell 500, includes transistors $TD_T$, $TD_F$, $TL_T$ and $TL_F$ adopting the second configuration.

In the second configuration, one can advantageously achieve a greater modulation or variation of the threshold voltage of the transistors.

For the cell 600 equipped with transistors $TD_T$, $TD_F$, $TL_T$ and $TL_F$ mounted in the first configuration, the potential differences between the gate and the source for the first conduction transistor $TD_T$ can be 0V, while the potential differences between the gate and the source of the second conduction transistor $TD_F$ is +VDD, which gives a total potential difference of 1×VDD.

As shown in FIG. 15B, in the cell 700 equipped with transistors adopting the second configuration, the potential differences between gate and drain for the first conduction transistor $TD_T$ can be −VDD, while the potential differences between gate and the drain of the second conduction transistor $TD_F$ is +VDD, which results in a total potential difference between the two conduction transistors of 2×VDD, larger than in the first configuration. The same applies to the load transistors $TL_T$ and $TL_F$.

An example of the operation of the cell 700 will now be given with reference to FIGS. 16 and 17.

Transistors $TD_T$, $TD_F$, $TL_T$, and $TL_F$ are connected in the second configuration with their respective piezoelectric operators. The respective threshold voltage of the transistors is capable of being modulated as a function of the mode, retention or read or write, in which the cell 700 happens to be.

In retention mode, the word line WL can be maintained at the earth potential GND. The access transistors $TA_T$ and $TA_F$ are in a cut-off state, and the information stored in the cell 700 is insulated from the bit lines $BL_T$ and $BL_F$.

The cell 700 is configured so that, in the retention mode, the threshold voltage of the first conduction transistor $TD_T$ is increased by $+\Delta VT_N$ in relation to a threshold voltage value $VT_N$ while the threshold voltage of the second charge transistor $TL_F$ is increased by $+\Delta |VT_P|$ in relation to a threshold voltage value $|VT_P|$, $VT_N$ and $VT_P$ corresponding to the threshold voltage of the PMOS and NMOS transistors when the gate is adhering to the gate dielectric layer, the threshold voltages then being minimal. The cell 700 is also configured so that, in the retention mode, the threshold voltage of the second conduction transistor $TD_F$ is equal to a threshold voltage value $VT_N$ while the threshold voltage of the first charge transistor $TL_T$ is equal to a threshold voltage value $|VT_P|$.

Figure 16:
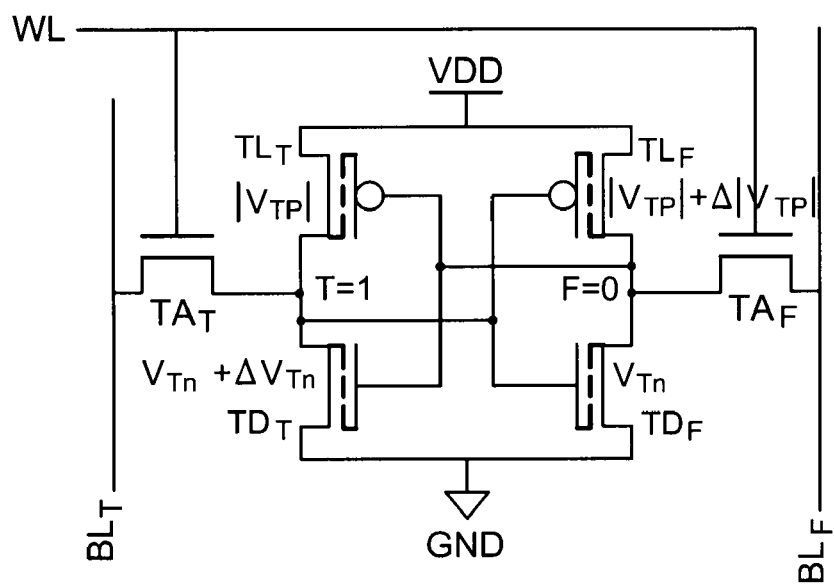
FIG. 16 illustrates an SRAM memory cell of the invention in retention mode.

This configuration of the threshold voltages of transistors $TD_T$, $TD_F$, $TL_T$, and $TL_F$ when the cell 700 is in retention mode is illustrated in FIG. 16. Such a configuration results in an improved Read Noise Margin (retention stability) of the cell 700 as well as reduced leakage currents. The increase in the threshold voltage of the first conduction transistor $TD_T$ and of the second charge transistor $TL_F$ respectively allow their current to be reduced below the threshold and limits the discharge of the storage node T and the charge of the storage node F, in a case where it is desired to preserve a logic level '1' in the first node T and a logic level '0' in the second node.

The low threshold voltage of the first charge transistor $TL_T$ and of the second conduction transistor $TD_F$ allows an increase in their conduction current, which reinforces the charging of node T and the discharging of node F.

Prior to accessing the cell 700 on read, the bit lines $BL_T$ and $BL_F$ can be charged to equal potential, VDD. Then in read mode, the word line WL is polarised to potential VDD in order to allow access to the storage nodes T, F of the cell 700. The stability of the cell 700 in read mode depends, in particular, on the value of the potential of the storage node F that is at logic level '0', the second node F for example. This voltage should preferably remain less than the switching voltage of the inverter connected to the storage node with logic level '1', the first node T for example. This condition linked to the voltage divider between the second bit line $BL_F$ and the earth GND of the cell 700, formed by the second access transistor $TA_F$ and the second conduction transistor $TD_F$ connected to the node at logic level '0'.

In order to improve the noise margin of the cell 700 on read, this cell is designed so that the linear current that passes through the second conduction transistor $TD_F$ is greater than the saturation current of the second access transistor $TA_F$.

The current gain ratio between the conduction and access transistors is typically of the order of 2. For transistors provided with a gate with a critical dimension of less than 65 nm, this ratio tends toward 3. The conduction transistors $TD_T$ and $TD_F$ and charge transistors $TL_T$ and $TL_F$ with mobile gate and piezoelectric operation of the gate, are used to endow the memory cell 700 with a current gain ratio that is greater than that of a 6T SRAM cell according to the prior art and of the same dimensions. The mechanical deformation of the piezoelectric material of the conduction transistors $TD_T$ and $TD_F$ and charge transistors $TL_T$ and $TL_F$ is used to modulate their threshold voltage favourably, so as to reinforce the stability of the cell on read SNM.

As for the retention mode described previously, in read mode, the threshold voltage of the first conduction transistor $TD_T$ and of the second charge transistor $TL_F$ is increased, which limits the discharging of node T and reduces the charging of node F respectively. The threshold voltage of the first charge transistor $TL_T$ and that of the second conduction transistor $TD_F$ are also low, which increases their conduction current and reinforces the charging of the first storage node T and the discharging of the second storage node F, in a case, for example, where the first node T is intended to be to a logic level '1', while node F is at a logic level '0'. Regarding the current gain ratio, between the conduction and access transistors, the latter increases in relation to the conventional case, where the stored information does not affect the threshold voltage of the transistors because of the increase in the conduction current of the second conduction transistor of transistor $TD_F$ associated with the reduction of its voltage.

Prior to a write, one of the two bit lines, the second bit line $BL_F$ for example, can be at potential VDD, while the complementary bit line $BL_F$ can be polarised to earth potential GND. Then the word line WL is polarised to potential VDD in order to write to the cell 700.

Figures 17A, 17B:
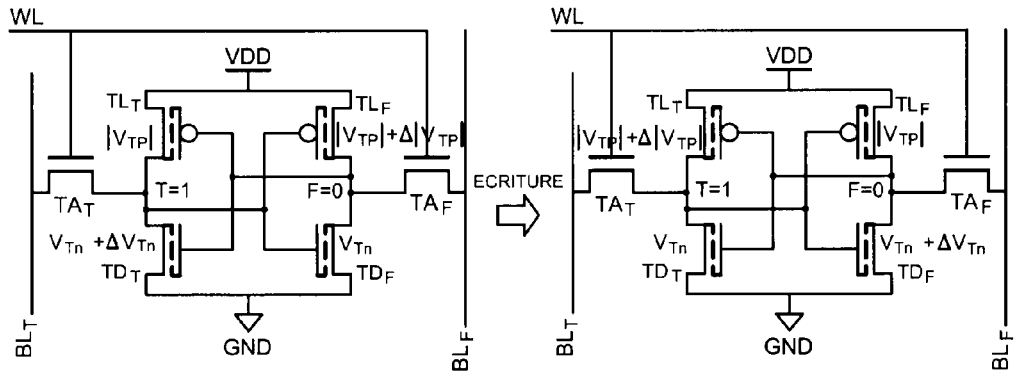
FIGS. 17A and 17B illustrate a write phase into an SRAM memory cell of the invention.

Switching of the logic information contained in the memory cell 700 is accompanied by a variation in the threshold voltages of the conduction transistors $TD_T$ and $TD_F$ and charge transistors $TL_T$ and $TL_F$, as illustrated in FIGS. 17A-17B.

The cell 700 is configured so that when it passes to write mode, the threshold voltage of the second conduction transistor $TD_F$ is able to increase, and pass from $(VT_N)$ to $(VT_N+\Delta VT_N)$, while the threshold voltage of the first charge transistor $TL_T$ is able to increase by $+\Delta |VT_P|$ in relation to a threshold voltage value $|VT_P|$. In this case, transistors $TD_F$ and $TL_T$ pass from a gate adhering state to a gate pull-back state.

The cell 700 is also configured so that, in the retention mode, the threshold voltage of the first conduction transistor $TD_T$ is able to decrease and pass from $(VT_N+\Delta VT_N)$ to $(VT_N)$, while the threshold voltage of the second charge transistor $TL_F$ reduces by $+\Delta |VT_P|$ in relation to a threshold voltage value $(|VT_P|+\Delta|VT_P|)$ In this case, the transistors $TD_T$ and $TL_F$ pass from a gate pull-back state to a gate adhering state.

This modulation of the threshold voltage is relative to the change of polarisation of the piezoelectric operators associated with each of the transistors $TL_T$, $TL_F$, $TD_T$ and $TD_F$. These changes of polarisation will lead to an additional deformation of the piezoelectric materials, modulating the potential differences between the gate and the surface of the channel of the transistors.

A "shut-down" mode, that is when the power supply voltage to the cell 700 is cut off, does not prevent preservation of the information stored in the nodes T and F. Even if these nodes lose their potential after shut-down of the power supplies, the information will be preserved by virtue of the non-volatile operation of transistors $TL_T$, $TL_F$, $TD_T$ and $TD_F$, as described above with reference to FIGS. 3, 4, 5, 6.

In "start-up" mode, the memory cell 700 has its power switched on. The storage nodes of the cell T and F voltage switch according to the last state stored, which is preserved because of a suitable difference between the return forces exerted on the layers of piezoelectric materials and the adhesion forces at the interface gate/gate dielectric of transistors $TL_T$, $TL_F$, $TD_T$ and $TD_F$.

Figure 18:
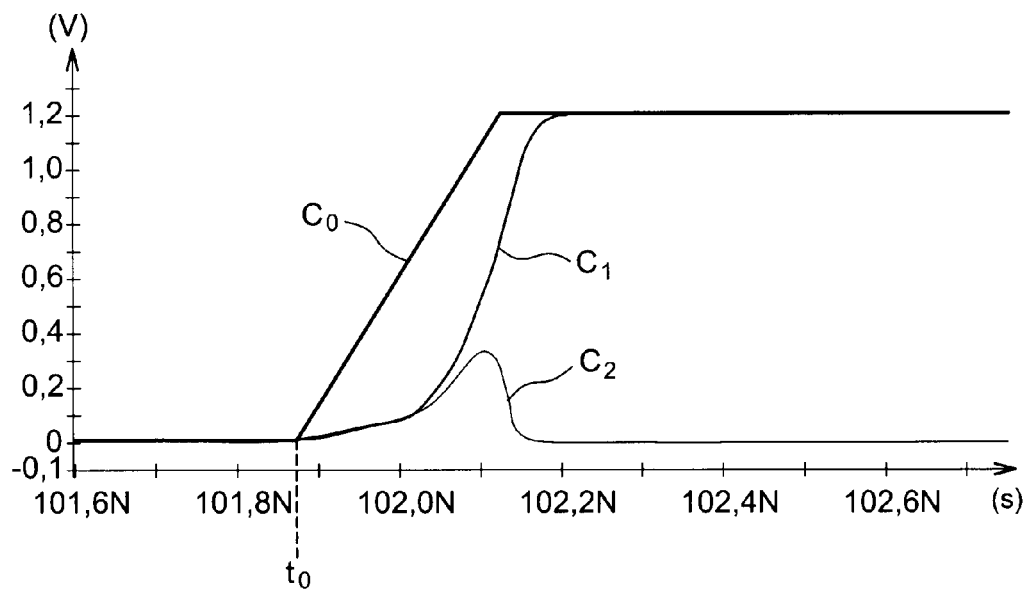
FIG. 18 illustrates a re-start of a memory cell of the invention and its non-volatile operation.

FIG. 18 illustrates a start-up phase of the memory cell 700. In this figure, curve C0 represents the behaviour of the power supply potential, while curves C1 and C2 respectively represent the behaviour of the potential at the first node T and the behaviour of the potential at the second node F. Before a given instant t0, the cell 700 has no power applied to it. Then, at instant t0, the cell 700 again has its power applied (curve C0 rising progressively to the VDD value).

The potential of the first node T returns to a value equal to VDD for example, corresponding to a logic state "1" (rising curve C1 goes to value VDD) while the potential of the second node F goes to a value of GND or 0 volts, for example, corresponding to a logic '0' state (curve C2).

The information that was present in nodes T and F before the shut-down of the power supply to the cell 700, is preserved to the extent that nodes T and F go to the potential that they had prior to the removal, with no need for a write operation.

The following table gives an example for comparison of the electrical characteristics of the cell 700 described previously, and of a standard 6T SRAM cell.

| Cells | Standard 6T cell | Cell 700 |
|---|---|---|
| $I_{OFF}$ (pA) | 44 | 19.4 |
| $I_{PG}$ (pA) | 7.6 | 7.6 |
| $I_{CELL\_}$ (µA) | 42 | 43 |
| SNM (mV) | 187 | 237 |

The results were obtained with gates with a critical dimension of the order of 65 nm, the cells 700 and 6T standard having the same dimensions.

Modulation of the threshold voltage of the conduction transistors $TD_T$, $TD_F$ and charge transistors $TL_T$ and $TL_F$, as used in cell 700, is used to improve the static noise margin (SNM) by the order of 50 mV, which is by more than 25%, and to reduce the leakage currents by a factor greater than 2.2 in relation to the standard 6T cell. The current, $I_{CELL}$, of the cell 700 is also improved in relation to the cell of the prior art.

DOCUMENTS MENTIONED

[NAT' 05]: S. Natarajan, et al., "*Emerging memory technologies—mainstream or hearsay?*", VLSI Design Automation and Test, 2005.

[TAK' 01]: K. Takeuchi, et al., "*A Study of Threshold Voltage Variation for Ultra Small Bulk and SOI CMOS*", IEEE TED, VOL. 48, No. 9, September 2004.

[YAM' 04]: M. YAMAOKA, et al., "*Low Power SRAM Menu for SOC Application Using Yin-Yang-Feedback memory Cell Technology*", Symposium on VLSI circuits, Digest of Technical Papers, Honolulu, USA, June 2004.

The invention claimed is:

1. A non-volatile random-access memory cell, including: at least a first plurality of transistors forming a switch, the transistors of the first plurality of transistors respectively including: a gate dielectric and a mobile gate, suspended above and disconnected from the gate dielectric, the gate being located at an adjustable distance from said gate dielectric, the transistors of the first plurality of transistors also being surmounted, respectively, by piezoelectric operating means adapted to move the gate in relation to a channel, the piezoelectric operating means including a stack formed of at least one layer of piezoelectric material resting on a first polarisation electrode, a second polarisation electrode resting on the layer of piezoelectric material.

2. The non-volatile random-access memory cell according to claim 1, the gate being attached to said first polarisation electrode and in contact with said first polarisation electrode.

3. The non-volatile random-access memory cell according to claim 2, where the transistors of the first plurality of transistors have a source zone connected to the second polarisation electrode of their respective piezoelectric operating means.

4. The non-volatile random-access memory cell according to claim 2, where the transistors of the first plurality of transistors have a drain zone connected to the second polarisation electrode of their respective piezoelectric operating means.

5. The non-volatile random-access memory cell according to claim 1, where the transistors of the first plurality of transistors are adapted respectively to adopt: at least a first position in which their gate is located at a first distance from the channel, and to adopt at least a second position in which the said gate is located at a second distance from the channel that is different from the first distance.

6. The non-volatile random-access memory cell according to claim 5, further including power supply means adapted to power the transistors of the first plurality of transistors and their respective operating means, the transistors of the first plurality of transistors being adapted respectively to adopt a given position among the said first position and second position, and also adapted to maintain the gate in the said given position after shut-down or removal of the said power supply means.

7. The non-volatile random-access memory cell according to claim 6, the transistors of the first plurality of transistors being adapted respectively to adopt a state in which the piezoelectric operating means are put into a given polarisation state, and in which the gate is maintained, effected by the piezoelectric operating means in contact with the gate dielectric, the transistors of the first plurality of transistors being also adapted respectively to adopt another state in which the piezoelectric operating means are not polarised, and in which the gate is maintained in contact with the gate dielectric by electrostatic adhesion.

8. The non-volatile random-access memory cell according to claim 1, in which the transistors of the first plurality of transistors have a variable threshold voltage which is able to vary by movement of the mobile gate, effected by the piezoelectric operating means.

9. The non-volatile random-access memory cell according to claim 8, liable to adopt several operating modes, at least one of which is a mode for retention of the information contained in the cell, at least one mode to read the information contained in the cell, and at least one mode to write to the cell, the transistors of the first plurality of transistor respectively having a variable threshold voltage.

10. A random-access active memory cell according to claim 9, the said first plurality of transistors including:
 a first charge transistor and a second charge transistor,
 a first conduction transistor and a second conduction transistor.

11. The random-access active memory cell according to claim 1, including at least a first access transistor and at least a second access transistor respectively placed between a first bit line and a first storage node, and between a second bit line and a second storage node.

12. An SRAM memory including a plurality of cells according to claim 1.

13. A microelectronic device including at least one SRAM memory according to claim 1.

\* \* \* \* \*